(12) United States Patent
Chen et al.

(10) Patent No.: US 12,419,417 B2
(45) Date of Patent: Sep. 23, 2025

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 126 days.

(21) Appl. No.: 18/380,665

(22) Filed: Oct. 17, 2023

(65) Prior Publication Data
US 2024/0344557 A1 Oct. 17, 2024

(30) Foreign Application Priority Data

Apr. 17, 2023 (TW) ................................. 112114466

(51) Int. Cl.
*A47B 88/57* (2017.01)
(52) U.S. Cl.
CPC ..................................... *A47B 88/57* (2017.01)
(58) Field of Classification Search
CPC . A47B 88/53; A47B 88/57; A47B 2210/0016; A47B 2210/0018
See application file for complete search history.

(56) References Cited

U.S. PATENT DOCUMENTS

| 5,135,294 | A | 8/1992 | Ohshima | |
| 6,367,899 | B1* | 4/2002 | Hwang | A47B 88/57 |
| | | | | 312/334.47 |
| 8,210,623 | B2 | 7/2012 | Chen | |
| 2004/0174100 | A1* | 9/2004 | Chen | A47B 88/50 |
| | | | | 312/333 |
| 2004/0174102 | A1* | 9/2004 | Chen | A47B 88/487 |
| | | | | 312/334.46 |
| 2013/0105427 | A1 | 5/2013 | Blume | |

(Continued)

FOREIGN PATENT DOCUMENTS

CN 102724844 B 1/2015

*Primary Examiner* — Matthew W Ing
(74) *Attorney, Agent, or Firm* — Winston Hsu

(57) ABSTRACT

A slide rail assembly includes a first rail, a second rail, a releasing member, a blocking member and an operating member. A first positioning structure, an assisting structure and a second positioning structure are arranged on the first rail. The assisting structure is located between the first positioning structure and the second positioning structure. The second rail is displaceable relative to the first rail and can be positioned at different positions by a blocking of at least one of the releasing member and the blocking member and one of the first positioning structure, the assisting structure and the second positioning structure. The operating member is configured to operate the releasing member and the blocking member for terminating the blocking of the at least one of the releasing member and the blocking member and the one of the first positioning structure, the assisting structure and the second positioning structure.

19 Claims, 20 Drawing Sheets

(56) References Cited

U.S. PATENT DOCUMENTS

| | | | |
|---|---|---|---|
| 2013/0259411 A1* | 10/2013 | Judge | F16C 29/04 384/49 |
| 2017/0340113 A1 | 11/2017 | Charest | |
| 2019/0200756 A1 | 7/2019 | Chen | |

* cited by examiner

SLIDE RAIL ASSEMBLY

BACKGROUND OF THE INVENTION

1. Field of the Invention

The present invention relates to a slide rail product, and more specifically, to a slide rail assembly having a blocking mechanism capable of positioning a second rail relative to a first rail at different positions.

2. Description of the Prior Art

In U.S. Pat. No. 8,210,623 B2, it discloses a damping device adapted for a slide rail assembly having a first rail and a second rail slidable relative to the first rail. The damping device includes a first supporting frame, a second supporting frame, a rack and a damper. The first supporting frame is fixedly mounted on the first rail. The second supporting frame is fixedly mounted on the second rail. The rack is mounted on the first supporting frame. The damper is mounted on the second supporting frame. The damper includes a container and a gear pivotally connected to the container. A damping material, e.g., thick and sticky liquid, is received inside the container. When the second rail is displaced relative to the first rail, the gear of the damper is driven by the rack to rotatably cooperate with the damping material received inside the container, so as to generate a constant damping force for resisting a movement of the second rail relative to the first rail.

However, in order to meet various requirements, it becomes an important topic to provide an improved slide rail product.

SUMMARY OF THE INVENTION

It is an objective of the present invention to provide a slide rail assembly having a blocking mechanism with a function of positioning a second rail relative to a first rail at different positions.

According to an aspect of the present invention, a slide rail assembly includes a first rail, a second rail, a releasing member, a blocking member and an operating member. A first positioning structure, at least one assisting structure and a second positioning structure are arranged on the first rail. The second rail is displaceable relative to the first rail. The releasing member is movably mounted on the second rail. The blocking member is movably mounted on the second rail. The operating member is movably mounted on the second rail. The operating member is configured to operate the releasing member and the blocking member to move from a first state to a second state. When the second rail is located at a first predetermined position relative to the first rail, the releasing member in the first state and the blocking member in the first state block two ends of the first positioning structure respectively for preventing the second rail from displacing from the first predetermined position along a first direction or a second direction opposite to the first direction. When the second rail is located at a second predetermined position relative to the first rail, the blocking member in the first state blocks one of two ends of the at least one assisting structure for preventing the second rail from displacing from the second predetermined position along the second direction. When the second rail is located at a third predetermined position, the releasing member in the first state and the blocking member in the first state block two ends of the second positioning structure respectively for preventing the second rail from displacing from the third predetermined position along the first direction or the second direction.

According to another aspect of the present invention, a slide rail assembly includes a first rail, a second rail, a blocking member, a first resilient portion and an operating member. An assisting structure and a positioning structure are arranged on the first rail. The second rail is displaceable relative to the first rail between a retracted position and an extended position. The blocking member is movably mounted on the second rail. The first resilient portion is configured to resiliently retain the blocking member in a first state. The operating member is movably mounted on the second rail. The operating member is configured to operate the blocking member to move from the first state to a second state. When the second rail is located at the extended position relative to the first rail, the blocking member in the first state blocks the positioning structure for preventing the second rail from displacing from the extended position along a retracting direction. When the operating member is applied by a force to drive the blocking member to move from the first state to the second state, the blocking member does not block the positioning structure for allowing the second rail to displace from the extended position along the retracting direction, and when the second rail is displaced from the extended position along the retracting direction and the operating member is released from the force, the blocking member moves from the second state back to the first state in response to the resilient force. When the second rail is displaced to a predetermined position relative to the first rail along the retracting direction, the blocking member in the first state blocks the assisting structure for preventing the second rail from displacing from the predetermined position along the retracting direction.

According to another aspect of the present invention, a slide rail assembly includes a first rail, a second rail, a blocking member, a first resilient portion and an operating member. A plurality of assisting structures are arranged on the first rail. Adjacent two of the plurality of assisting structures are spaced from each other by a predetermined longitudinal distance. The second rail longitudinally is displaceable relative to the first rail between a retracted position and an extended position. The blocking member is movably mounted on the second rail. The first resilient portion is configured to provide a resilient force to resiliently retain the blocking member in a first state. The operating member is movably mounted on the second rail. The operating member is configured to operate the blocking member to move from the first state to a second state. The blocking member in the first state is configured to block one of the plurality of assisting structures for preventing the second rail from displacing from a predetermined position along a retracting direction. The operating member is configured to operate the blocking member to move from the first state to the second state, such that the blocking member does not block the one of the plurality of assisting structures for allowing the second rail to displace to the retracted position along the retracting direction.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The members of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct mechanical connection. Thus, if a first device is connected to a second device, that connection may be through a direct mechanical connection, or through an indirect mechanical connection via other devices and connections.

Figure 1:
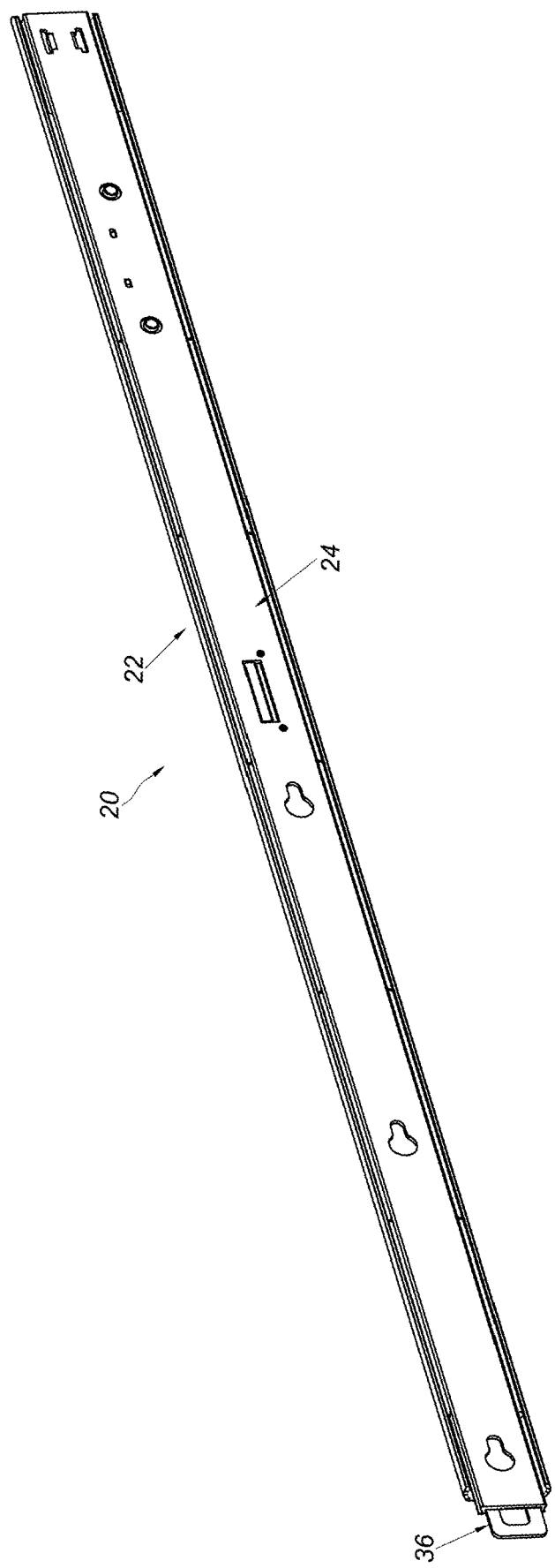
FIG. 1 is a schematic diagram of a slide rail assembly according to an embodiment of the present invention.
Figure 2:
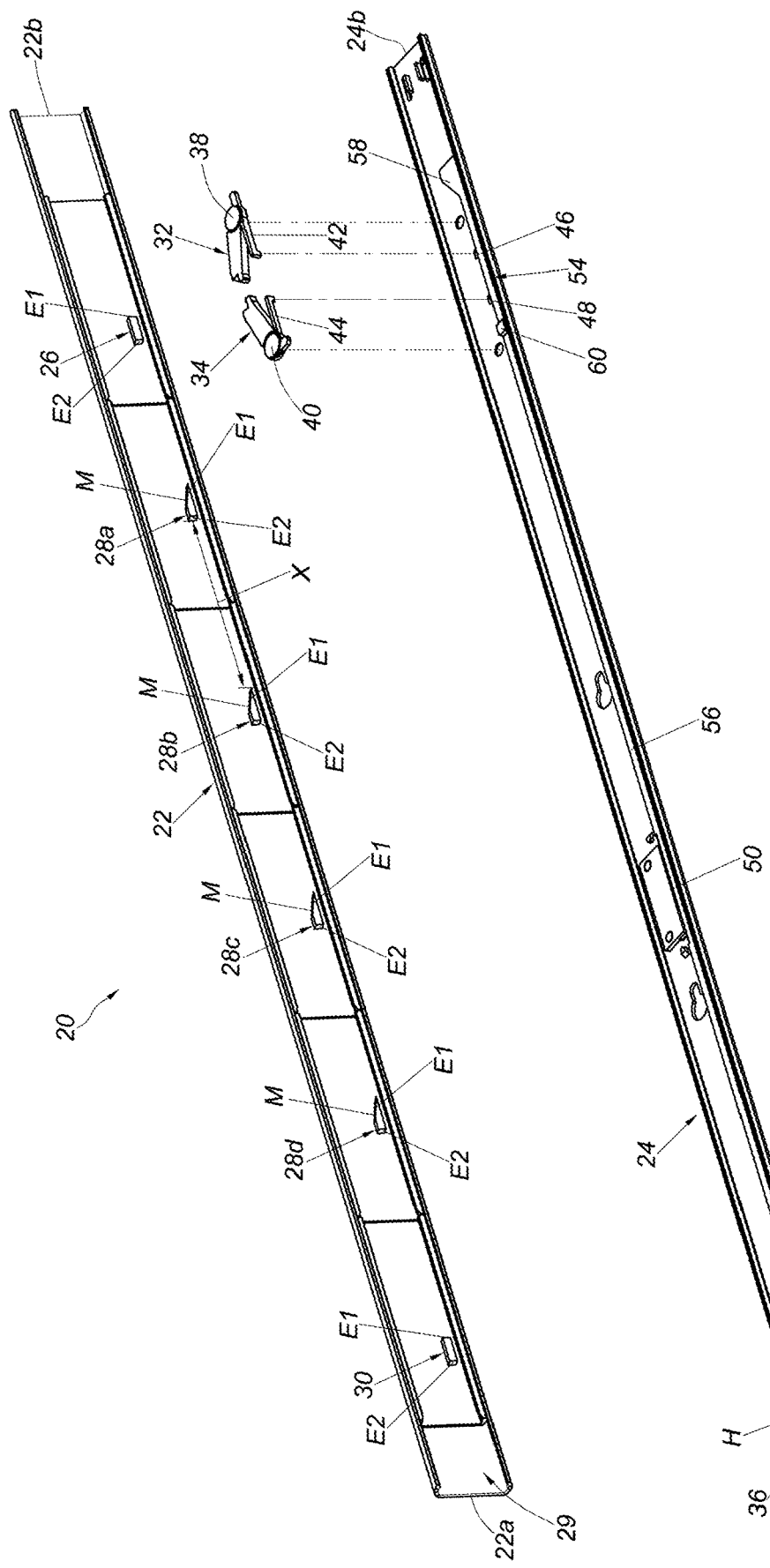
FIG. 2 is an exploded diagram of the slide rail assembly according to the embodiment of the present invention.

As shown in FIG. 1 and FIG. 2, a slide rail assembly 20 includes a first rail 22 and a second rail 24 displaceable relative to the first rail 22 longitudinally. A first positioning structure 26, at least one assisting structure and a second positioning structure 30 are arranged on the first rail 22. The at least one assisting structure is located between the first positioning structure 26 and the second positioning structure 30. In this embodiment, by way of example, there can be a plurality of assisting structures between the first positioning structure 26 and the second positioning structure 30, and the plurality of assisting structures include a first assisting structure 28a, a second assisting structure 28b, a third assisting structure 28c and a fourth assisting structure 28d. However, the present invention is not limited to this embodiment. It depends on practical demands. For example, in another embodiment, there can be only one of the first assisting structure, the second assisting structure, the third assisting structure and the fourth assisting structure.

Preferably, the first positioning structure 26 and the second positioning structure 30 can have substantially identical structures, and the first assisting structure 28a, the second assisting structure 28b, the third assisting structure 28c and the fourth assisting structure 28d can have substantially identical structures.

Preferably, as shown in FIG. 2, in this embodiment, by way of example, the first positioning structure 26, the first assisting structure 28a, the second assisting structure 28b, the third assisting structure 28c, the fourth assisting structure 28d and the second positioning structure 30 can be arranged sequentially along a longitudinal direction at equal intervals X. In other words, adjacent two of the first positioning structure 26, the first assisting structure 28a, the second assisting structure 28b, the third assisting structure 28c, the fourth assisting structure 28d and the second positioning structure 30 can be spaced from each other by a predetermined longitudinal distance. However, the present invention is not limited to this embodiment. For example, in another embodiment, the first positioning structure, the first assisting structure, the second assisting structure, the third assisting structure, the fourth assisting structure and the second positioning structure can be sequentially arranged along the longitudinal direction at unequal intervals.

Preferably, the first positioning structure 26, the first assisting structure 28a, the second assisting structure 28b, the third assisting structure 28c, the fourth assisting structure 28d and the second positioning structure 30 can be arranged onto the first rail 22 directly or indirectly.

Preferably, the first positioning structure 26, the first assisting structure 28a, the second assisting structure 28b, the third assisting structure 28c, the fourth assisting structure 28d and the second positioning structure 30 can be protrusions.

The slide rail assembly 20 further includes a releasing member 32 movably mounted on the second rail 24, a blocking member 34 movably mounted on the second rail 24 and an operating member 36 movably mounted on the second rail 24. In this embodiment, by way of example, the blocking member 34 and the releasing member 32 can be pivotally connected to the second rail 24 by a first shaft 40 and a second shaft 38, respectively.

The operating member 36 is configured to operate the releasing member 32 and the blocking member 34. The releasing member 32 can be configured to allow or restrain a displacement of the second rail 24 relative to the first rail 22 along a first direction D1, and the blocking member 34 can configured to allow or restrain a displacement of the second rail 24 relative to the first rail 22 along a second direction D2. Understandably, in another embodiment, the slide rail assembly can include the blocking member and the operating member configured to operate the blocking member only, i.e., the releasing member can be omitted, when it is only desired to restrain the displacement of the second rail 24 relative to the first rail 22 along the second direction D2.

Figure 3:
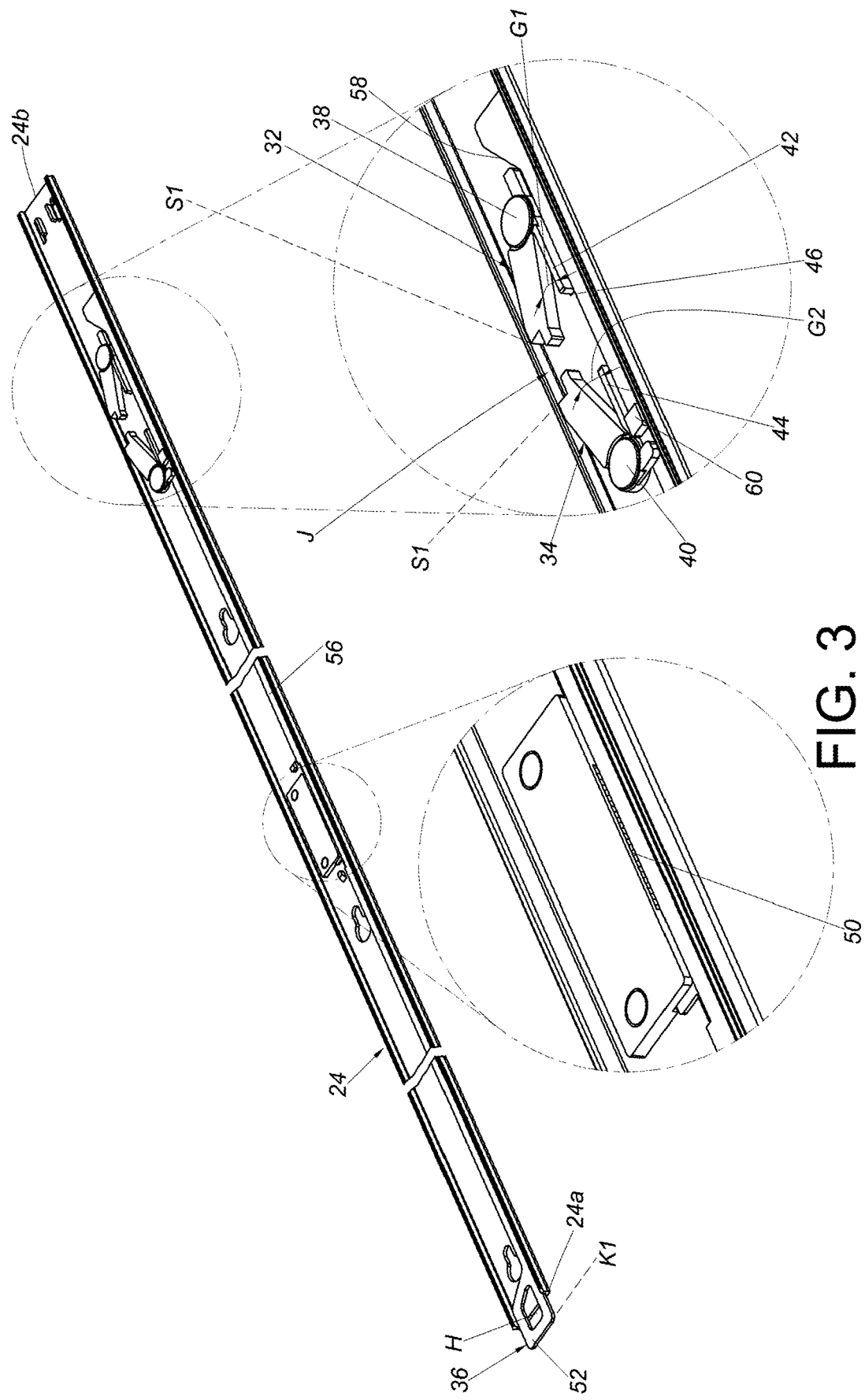
FIG. 3 is a partial diagram of the slide rail assembly as an operating member is located at a first operating position according to the embodiment of the present invention.

Preferably, the slide rail assembly 20 further includes a first resilient portion 44 and a second resilient portion 42 configured to resiliently retain the blocking member 34 and the releasing member 32 in a first state S1, respectively. As shown in FIG. 3, in this embodiment, by way of example, the first resilient portion 44 and the second resilient portion 42 can be resilient arms or resilient legs integrally connected to the blocking member 34 and the releasing member 32 respectively, wherein a first predetermined gap G1 can be formed between the second resilient portion 42 and the releasing member 32, and a second predetermined gap G2 can be formed between the first resilient portion 44 and the blocking member 34. However, the present invention is not limited to this embodiment. Besides, the first resilient portion 44 and the second resilient portion 42 abut against a first predetermined portion 48 and a second predetermined portion 46 of the second rail 24, respectively. In this embodiment, by way of example, each of the first predetermined portion 48 and the second predetermined portion 46 can be a hole or a slot, and each of the first resilient portion 44 and the second resilient portion 42 can include a bending section inserted into a corresponding one of the first predetermined portion 48 and the second predetermined portion 46 and abutted by a wall of the corresponding one of the first predetermined portion 48 and the second predetermined portion 46. However, the present invention is not limited to this embodiment. For example, in another embodiment, each of the first predetermined portion and the second predetermined portion can be a wall or a protruding portion.

Figure 6:
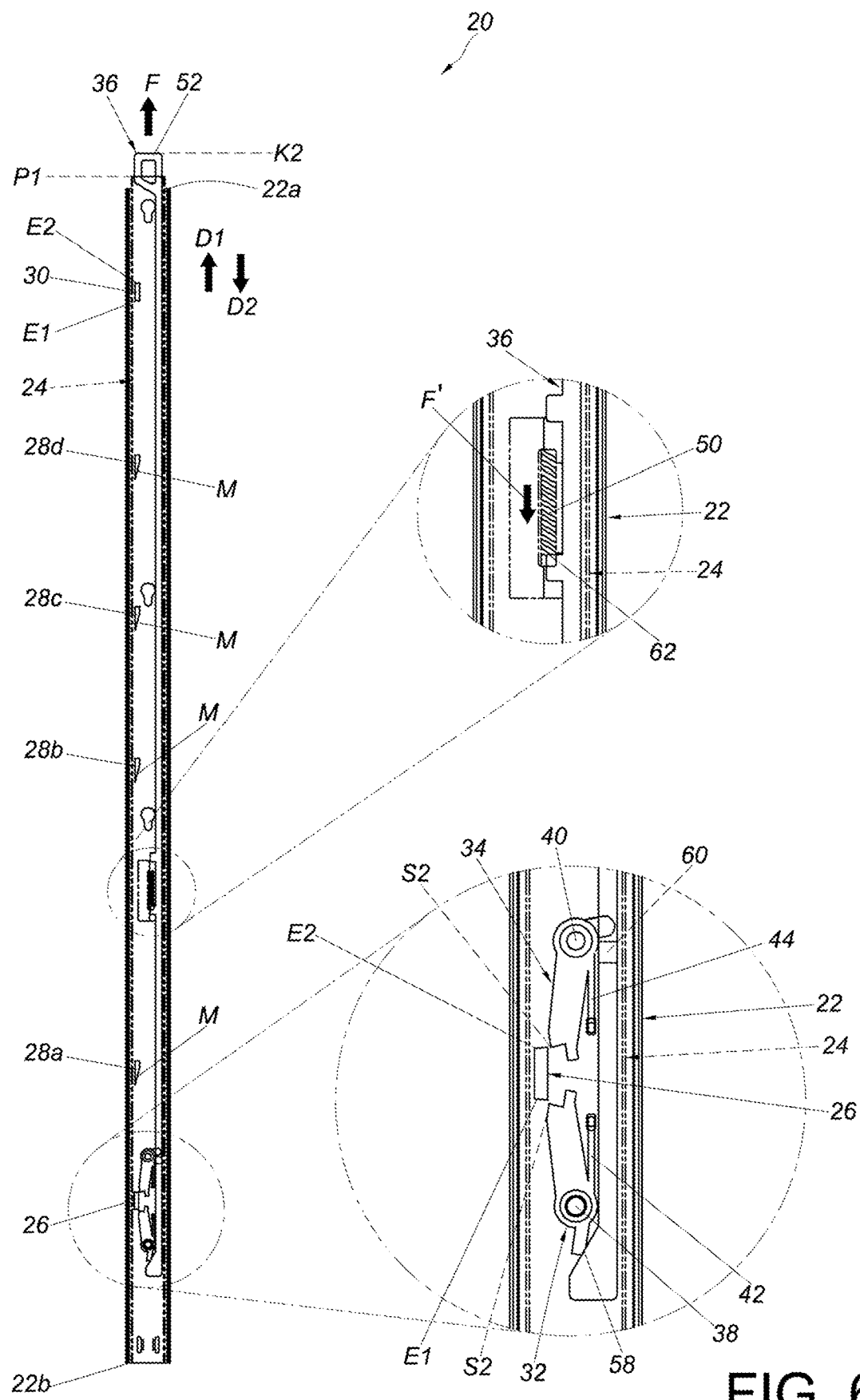
FIG. 6 is a diagram illustrating that the second rail is allowed to displace from the first predetermined position along the first direction or the second direction according to the embodiment of the present invention.

Preferably, as shown in FIG. 3 and FIG. 6, the slide rail assembly 20 further includes a recovering resilient member 50 configured to provide a recovering resilient force F' to the operating member 36.

Preferably, each of the first positioning structure 26, the first assisting structure 28a, the second assisting structure 28b, the third assisting structure 28c, the fourth assisting structure 28d and the second positioning structure 30 includes two opposite ends, e.g., a first end E1 and a second end E2.

Preferably, a blocking structure can be arranged on each of the first end E1 and the second end E2 of the first positioning structure 26 and the first end E1 and the second end E2 of the second positioning structure 30, wherein the blocking structure can be a blocking wall or a vertical wall. Furthermore, a guiding section M can be arranged adjacent to the first end E1 of each of the first assisting structure 28a, the second assisting structure 28b, the third assisting structure 28c and the fourth assisting structure 28d, and a blocking section can be arranged on the second end E2 of each of the first assisting structure 28a, the second assisting structure 28b, the third assisting structure 28c and the fourth assisting structure 28d, wherein the guiding section M can be an inclined surface or an arc surface, and the blocking section can be a blocking wall or a vertical wall.

Preferably, the first rail 22 includes a front end portion 22a and a rear end portion 22b. The second rail 24 includes a front end portion 24a and a rear end portion 24b. The first positioning structure 26 is located adjacent to the rear end portion 22b of the first rail 22. The second positioning structure 30 is located adjacent to the front end portion 22a of the first rail 22.

Preferably, the first rail 22 further includes a channel 29 for receiving the second rail 24. Furthermore, the first positioning structure 26, the first assisting structure 28a, the second assisting structure 28b, the third assisting structure 28c, the fourth assisting structure 28d and the second positioning structure 30 are located inside the channel 29 of the first rail 22.

Preferably, the releasing member 32 and the blocking member 34 are located adjacent to the rear end portion 24b of the second rail 24. The operating member 36 includes an operating portion 52, a driving portion 54 and an extending portion 56 connected between the operating portion 52 and the driving portion 54. The operating portion 52 is located adjacent to the front end portion 24a of the second rail 24. For example, the operating portion 52 can protrude beyond the front end portion 24a of the second rail 24 and include an opening H for easy operation. The driving portion 54 can include a first driving section 58 and a second driving section 60 configured to drive the releasing member 32 and the blocking member 34, respectively. The extending portion 56 can extend along a length direction of the second rail 24, i.e., the longitudinal direction. Understandably, in another embodiment, the operating member is configured to operate the releasing member or the blocking member only, e.g., the driving portion can include one of the first driving section and the second driving section for driving a corresponding one of the releasing member and the blocking member, when the blocking member is configured to drive the releasing member to move together with the blocking member or the releasing member is configured to drive the blocking member to move together with the releasing member.

Preferably, in this embodiment, the releasing member 32 and the blocking member 34 can be made of non-metallic material, e.g., plastic material. However, the present invention is not limited to this embodiment.

Figure 4:
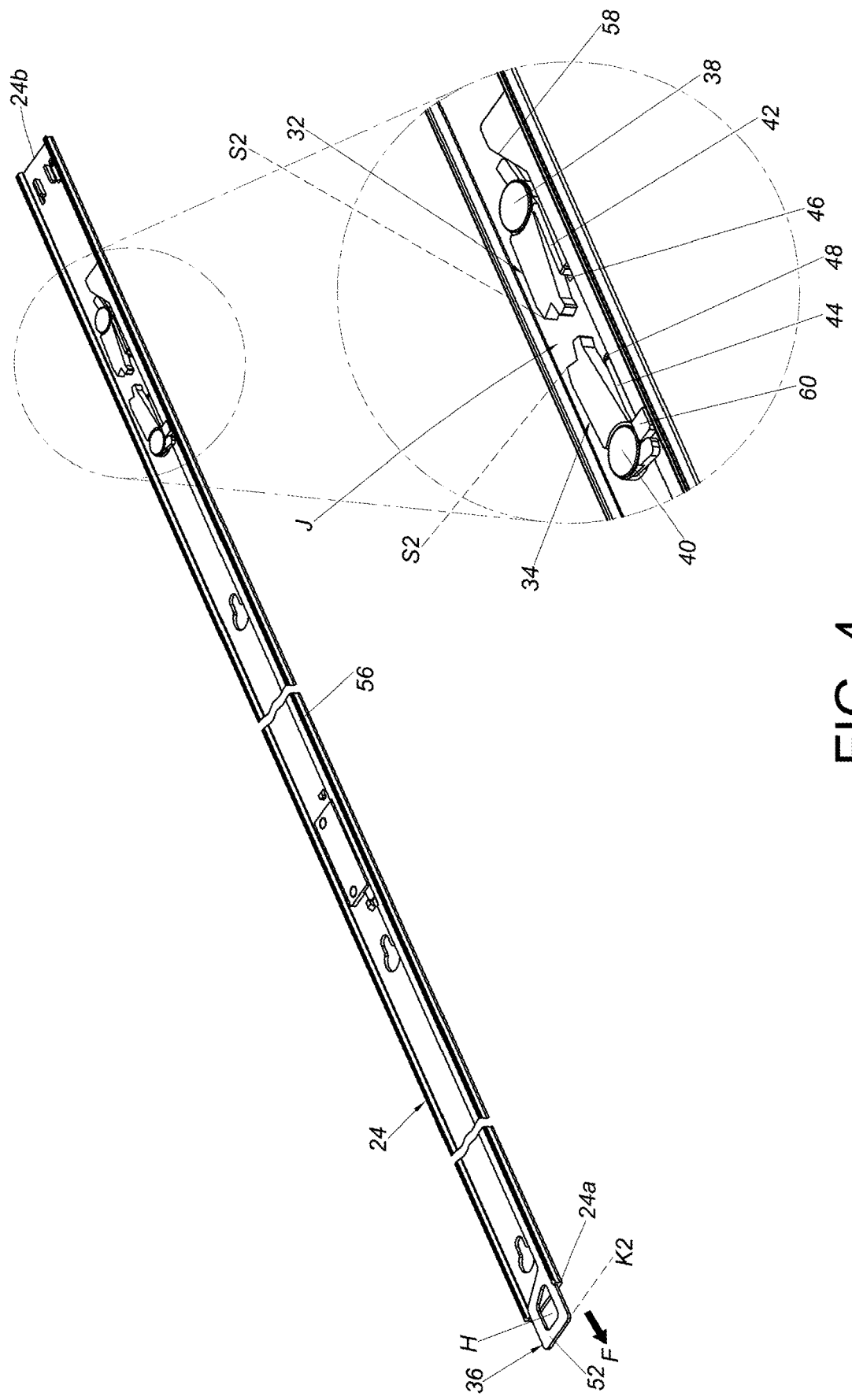
FIG. 4 is a partial diagram of the slide rail assembly as the operating member is located at a second operating position according to the embodiment of the present invention.

As shown in FIG. 3 and FIG. 4, a space J is defined between the releasing member 32 and the blocking member 34 and configured to receive one of the first positioning structure 26, the first assisting structure 28a, the second assisting structure 28b, the third assisting structure 28c and the fourth assisting structure 28d and the second positioning structure 30. The operating member 36 is configured to operate the releasing member 32 and the blocking member 34 to move from the first state S1 as shown in FIG. 3 to a second state S2 as shown in FIG. 4. For example, when the operating portion 52 of the operating member 36 is applied by a force F to drive the operating member 36 to move from a first operating position K1 as shown in FIG. 3 to a second operating position K2 as shown in FIG. 4, the first driving section 58 and the second driving section 60 of the operating member 36 drive the releasing member 32 and the blocking member 34 to pivot from the first state S1 as shown in FIG. 3 to the second state S2 as shown in FIG. 4 respectively, such that the recovering resilient member 50 is resiliently deformed by the operating member 36, and the first resilient portion 44 and the second resilient portion 42 are resiliently deformed by the first predetermined portion 48 and the second predetermined portion 46 of the second rail 24 respectively. It should be noticed that when the operating portion 52 of the operating member 36 is released from the force F, the operating member 36 recovers from the second operating position K2 as shown in FIG. 4 to the first operating position K1 as shown in FIG. 3 in response to the recovering resilient force F' provided by the resiliently deformed recovering resilient member 50, and the releasing member 32 and the blocking member 34 recover from the second state S2 as shown in FIG. 4 to the first state S1 as shown in FIG. 3 in response to resilient forces provided by the resiliently deformed second resilient portion 42 and the resiliently deformed first resilient portion 44, respectively.

Figure 5:
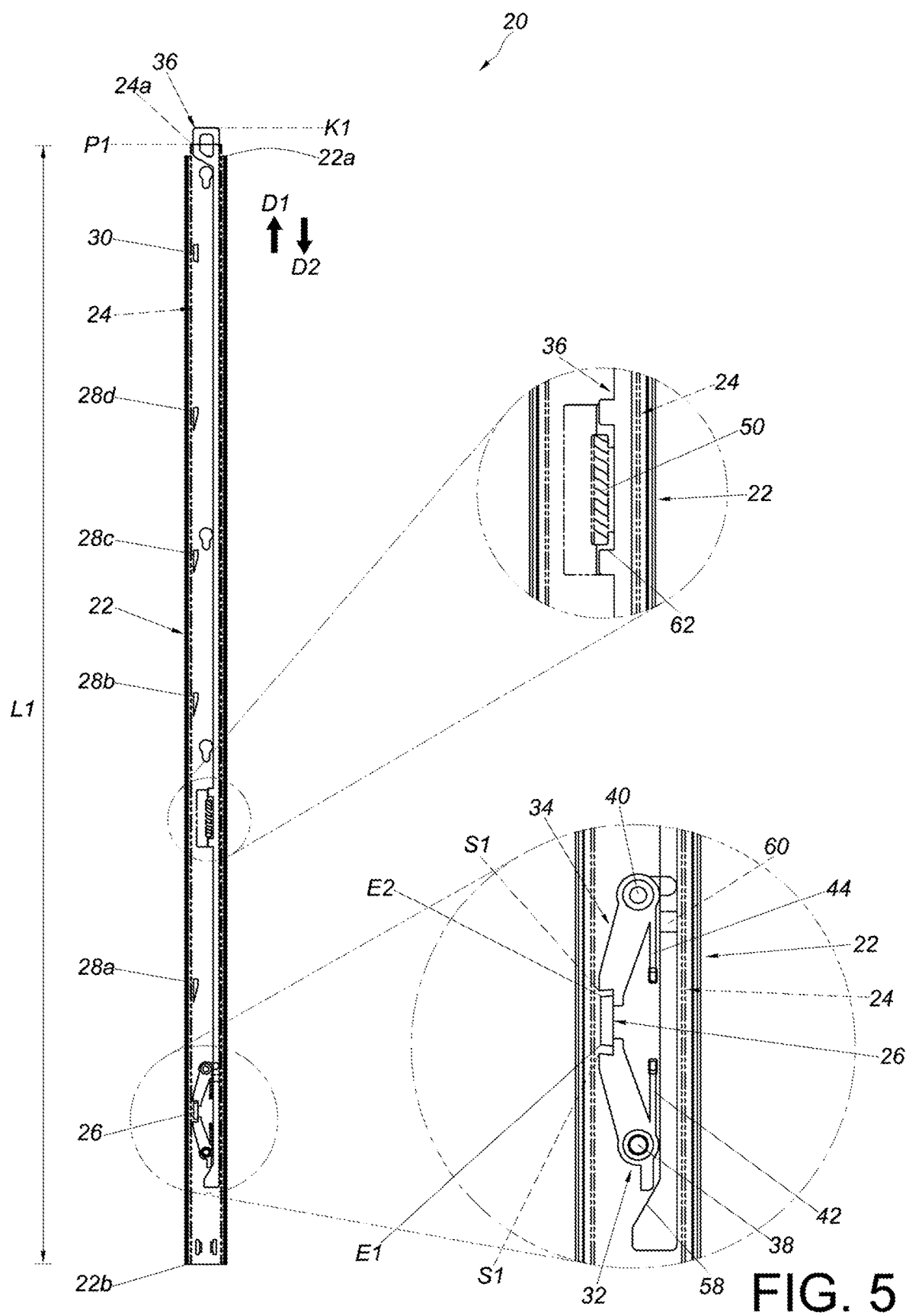
FIG. 5 is a diagram illustrating that a second rail is prevented from displacing from a first predetermined position along a first direction or a second direction according to the embodiment of the present invention.

As shown in FIG. 5, the first rail 22 can be vertically mounted on an object, which is not shown in the figure. In other words, the rear end portion 22b of the first rail 22 can face downwardly, e.g., toward a ground surface, and the front end portion 22a of the first rail 22 can face upwardly. Besides, as shown in FIG. 5, when the second rail 24 is located at a first predetermined position P1, e.g., a retracted position, relative to the first rail 22, the slide rail assembly 20 has a first length L1, and the releasing member 32 in the first state S1 and the blocking member 34 in the first state S1 block the first end E1 and the second end E2 of the first positioning structure 26 respectively to generate a bidirectional blocking effect for preventing the second rail 24 from displacing from the first predetermined position P1 along the first direction D1, e.g., an opening direction, or the second direction D2, e.g., a retracting direction. Furthermore, as shown in FIG. 5, at this moment, the operating member 36 is retained at the first operating position K1 in response to the recovering resilient force F' provided by the recovering resilient member 50. Preferably, the operating member 36 further includes an extending section 62 located at a position corresponding to the resilient recovering member 50.

When the operating portion 52 of the operating member 36 is applied by the force F to drive the operating member 36 to move from the first operating position K1 as shown in FIG. 5 to the second operating position K2 as shown in FIG. 6 along the first direction D1 relative to the second rail 24 located at the first predetermined position P1, the first driving section 58 and the second driving section 60 of the operating member 36 drive the releasing member 32 and the blocking member 34 to pivot from the first state S1 as shown in FIG. 5 to the second state S2 as shown in FIG. 6 respectively, such that the releasing member 32 in the second state S2 and the blocking member 34 in the second state S2 do not block the first end E1 and the second end E2 of the first positioning structure 26 respectively for allowing the second rail 24 to displace from the first predetermined position P1 along the first direction D1 or the second direction D2. Besides, as shown in FIG. 6, at this moment, the recovering resilient member 50 is resiliently deformed by the extending section 62 of the operating member 36, and the first resilient portion 44 and the second resilient portion 42 are resiliently deformed by the first predetermined portion 48 and the second predetermined portion 46, respectively.

It should be noticed that when the second rail 24 is displaced from the first predetermined position P1 along the first direction D1 and the operating member 36 is released from the force F, the releasing member 32 and the blocking member 34 can recover back to the first state S1 in response to the resilient forces provided by the second resilient portion 42 and the first resilient portion 44, respectively. Afterwards, when the second rail 24 is further displaced from the first predetermined position P1 along the first direction D1, the releasing member 32 and the blocking member 34 can pass over the first assisting structure 28a, the second assisting structure 28b, the third assisting structure 28c and the fourth assisting structure 28d until the releasing member 32 and the blocking member 34 are located at positions corresponding to the first end E1 and the second end E2 of the second positioning structure 30, respectively. Preferably, during the aforementioned displacement of the second rail 24 from the first predetermined position P1 along the first direction D1, each of the guiding section M facilitates the releasing member 32 and the blocking member 34 to pass over a corresponding one of the first assisting structure 28a, the second assisting structure 28b, the third assisting structure 28c and the fourth assisting structure 28d.

Figure 7:
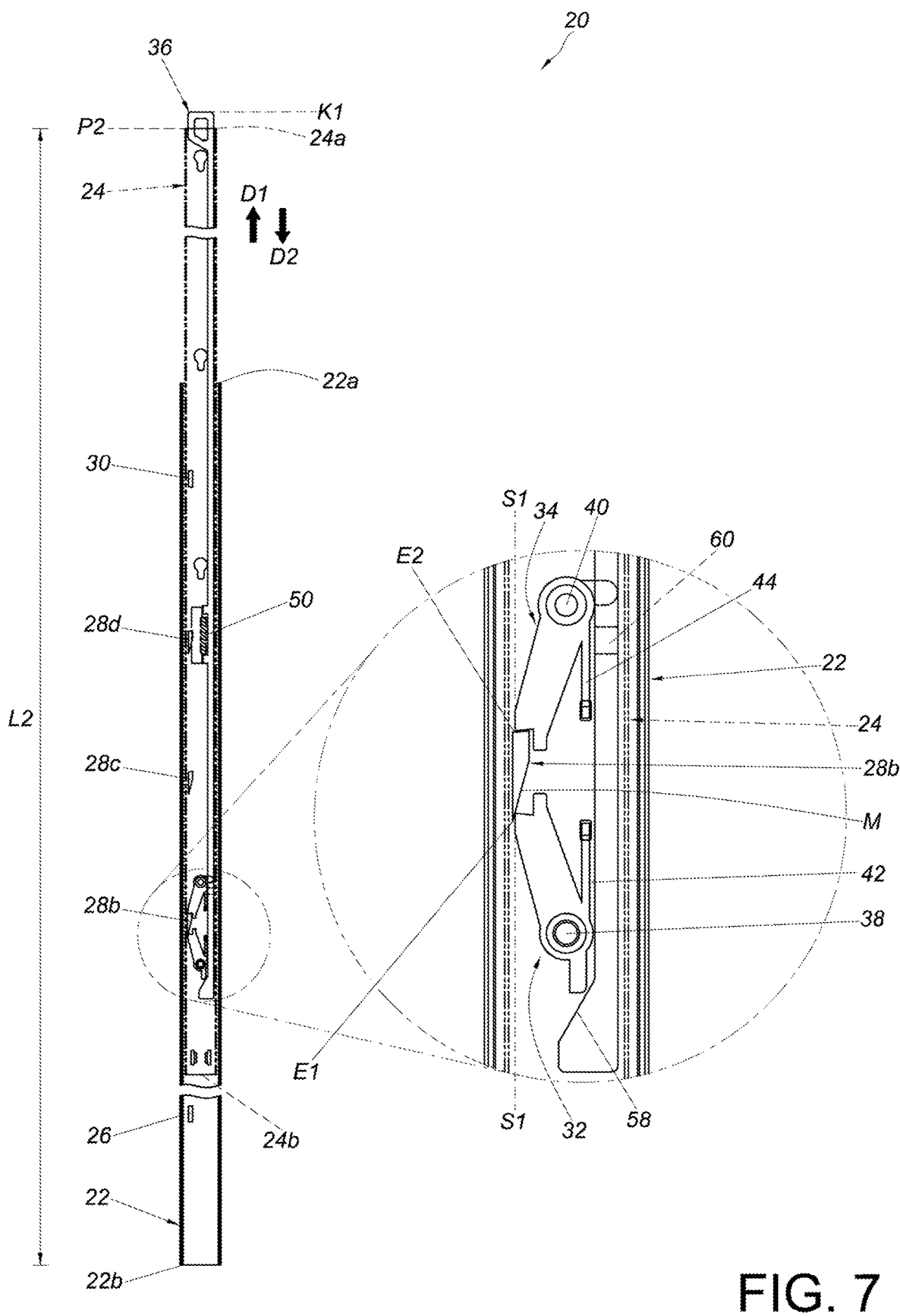
FIG. 7 is a diagram illustrating that the second rail is prevented from displacing from a second predetermined position along the second direction according to the embodiment of the present invention.

When the second rail 24 is displaced from the first predetermined position P1 along the first direction D1, e.g., to a second predetermined position P2 as shown in FIG. 7, the blocking member 34 in the first state S1 can block the second end E2 of the second assisting structure 28b for preventing the second rail 24 from displacing from the second predetermined position P2 along the second direction D2. Besides, as shown in FIG. 7, when the second rail 24 is located at the second predetermined position P2, the slide rail assembly 20 has a second length L2.

For example, when the second rail 24 is displaced from the first predetermined position P1 to the second predetermined position P2 along the first direction D1 and the operating member 36 is released from the force F for recovering the operating member 36 from the second operating position K2 back to the first operating position K1, the releasing member 32 and the blocking member 34 recover from the second state S2 back to the first state S1, such that the blocking member 34 in the first state S1 blocks the second end E2 of the second assisting structure 28b to generate a unidirectional blocking effect for preventing the second rail 24 from displacing from the second predetermined position P2 along the second direction D2. It should be noticed that, as shown in FIG. 7, at this moment, the second rail 24 is allowed to displace from the second predetermined position P2 along the second direction D2 only when the operating member 36 is operated to drive the blocking member 34 to pivot from the first state S1 to the second state S2.

Figure 8:
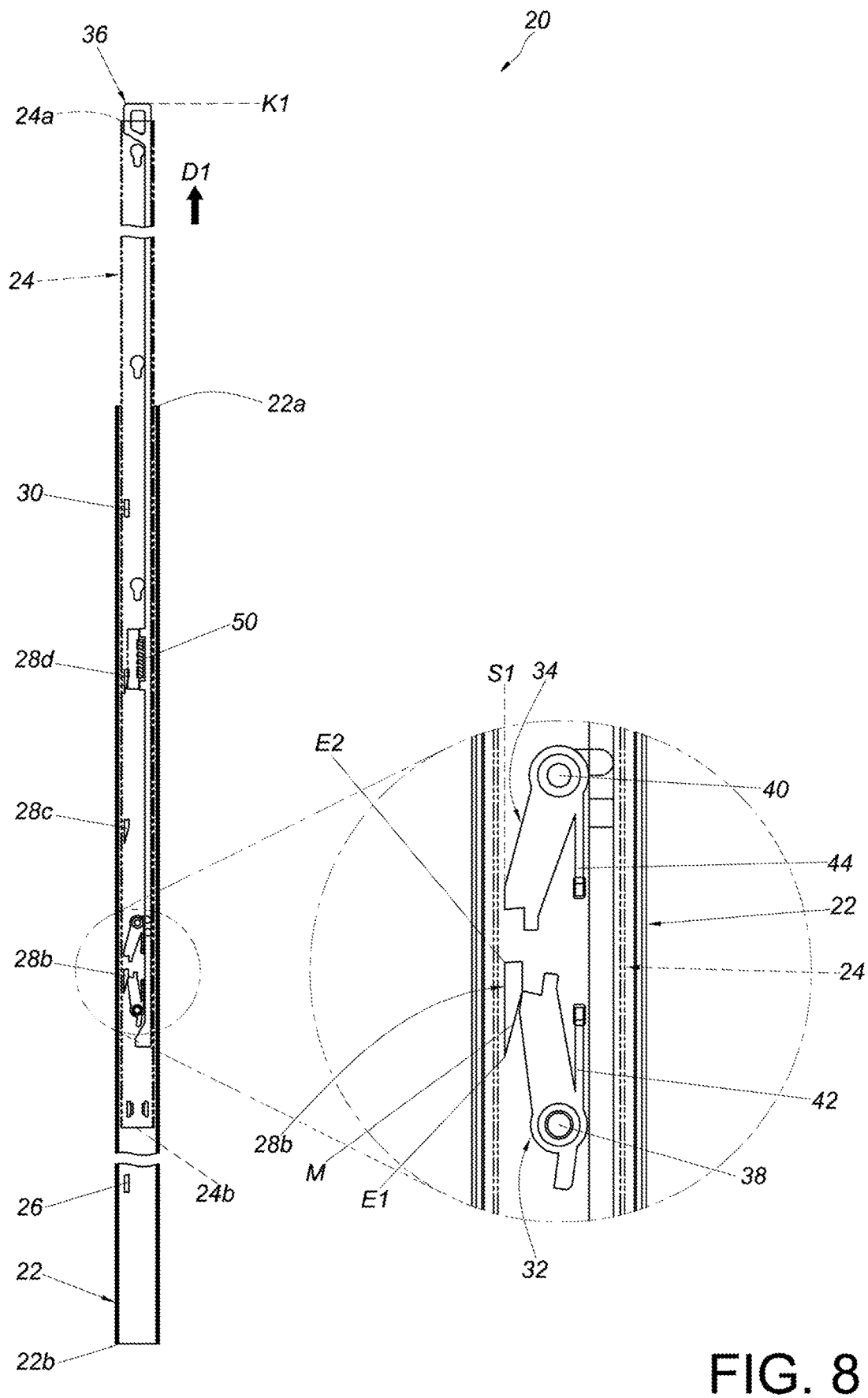
FIG. 8 is a diagram illustrating that the second rail is displaced from the second predetermined position along the first direction according to the embodiment of the present invention.

As shown in FIG. 7 and FIG. 8, when the second rail 24 is located at the second predetermined position P2, the second rail 24 is still allowed to displace from the second predetermined position P2 along the first direction D1 due to the unidirectional blocking effect. During a displacement of the second rail 24 from the second predetermined position P2 along the first direction D1, the releasing member 32 can be abutted by the guiding section M of the second assisting structure 28b to pivot and resiliently deform the second resilient portion 42, so as to pass over the second assisting structure 28b.

Figure 9:
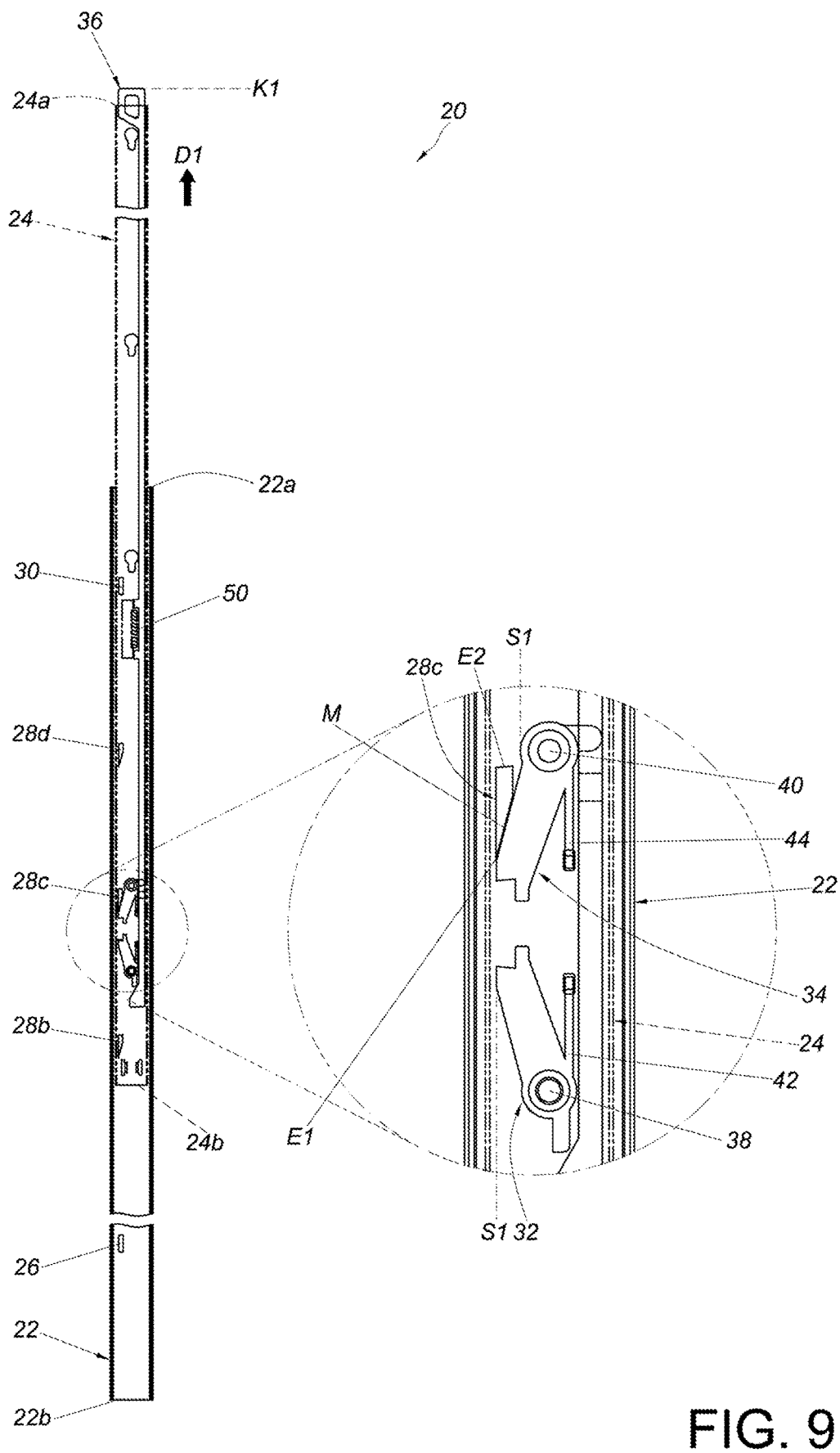
FIG. 9 is a diagram illustrating that the second rail is displaced from a position as shown in FIG. 8 along the first direction according to the embodiment of the present invention.
Figure 10:
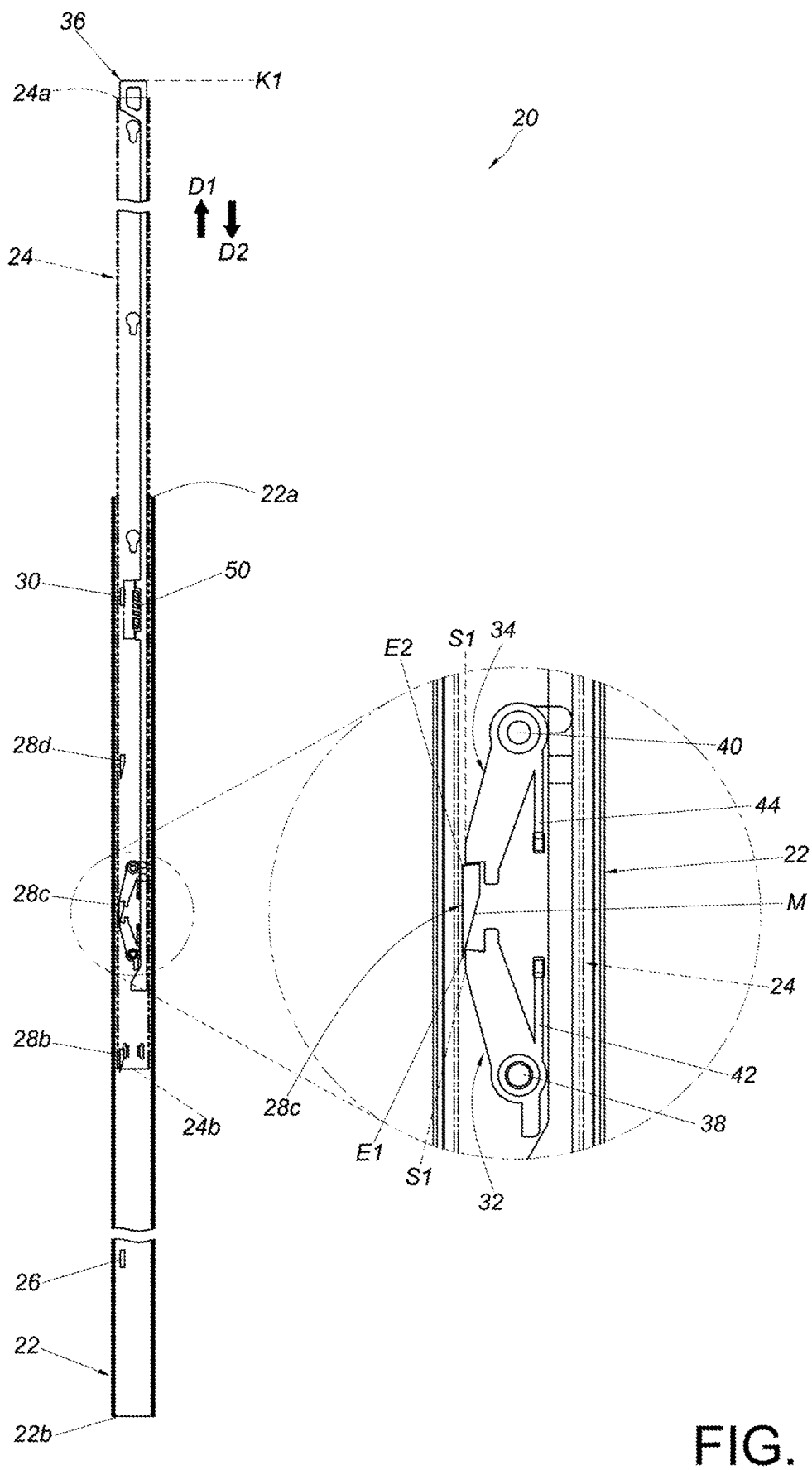
FIG. 10 is a diagram illustrating that the second rail is prevented from displacing from another predetermined position between the second predetermined position and a third predetermined position along the second direction according to the embodiment of the present invention.

Furthermore, during a displacement of the second rail 24 from a position as shown in FIG. 9 to another predetermined position as shown in FIG. 10 along the first direction D1, the releasing member 32 can be retained in the first state S1 in response to the resilient force provided by the second resilient portion 42, and the blocking member 34 in the first state S1 can be abutted by the guiding section M of the third assisting structure 28c to pivot and resiliently deform the first resilient portion 44, so as to pass over the third assisting structure 28c. When the blocking member 34 passes over the third assisting structure 28c and recovers back to the first state S1 in response to the resilient force provided by the first resilient portion 44, the blocking member 34 in the first state S1 can block the second end E2 of the third assisting structure 28c to generate the unidirectional blocking effect for preventing the second rail 24 from displacing from the another predetermined position as shown in FIG. 10 along the second direction D2. It should be noticed that, as shown in FIG. 10, at this moment, the second rail 24 is allowed to displace from the another predetermined position along the second direction D2 only when the operating member 36 is operated to drive the blocking member 34 to pivot from the first state S1 to the second state S2.

Figure 11:
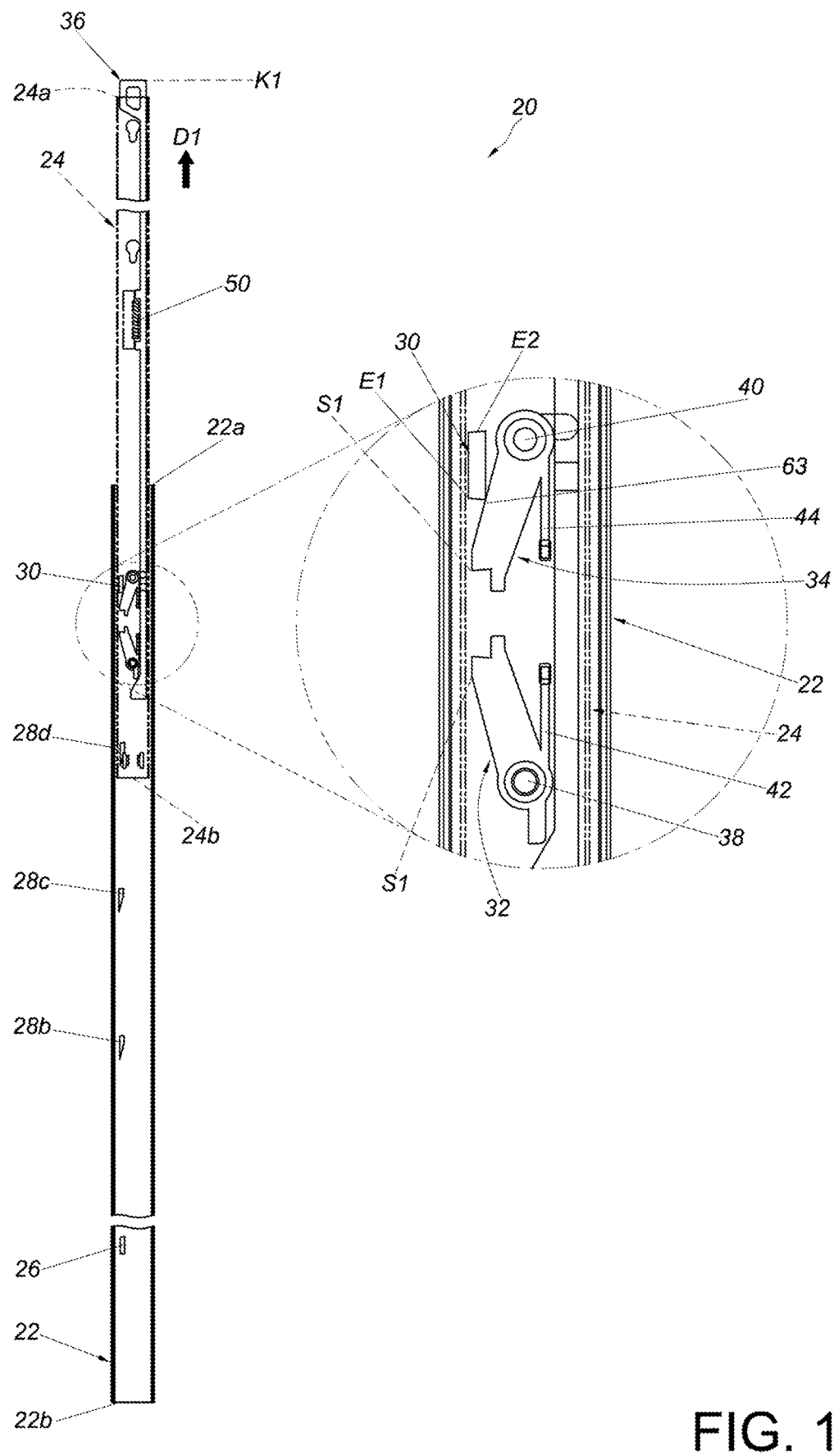
FIG. 11 is a diagram illustrating that the second rail is displaced from the another predetermined position along the first direction according to the embodiment of the present invention.
Figure 12:
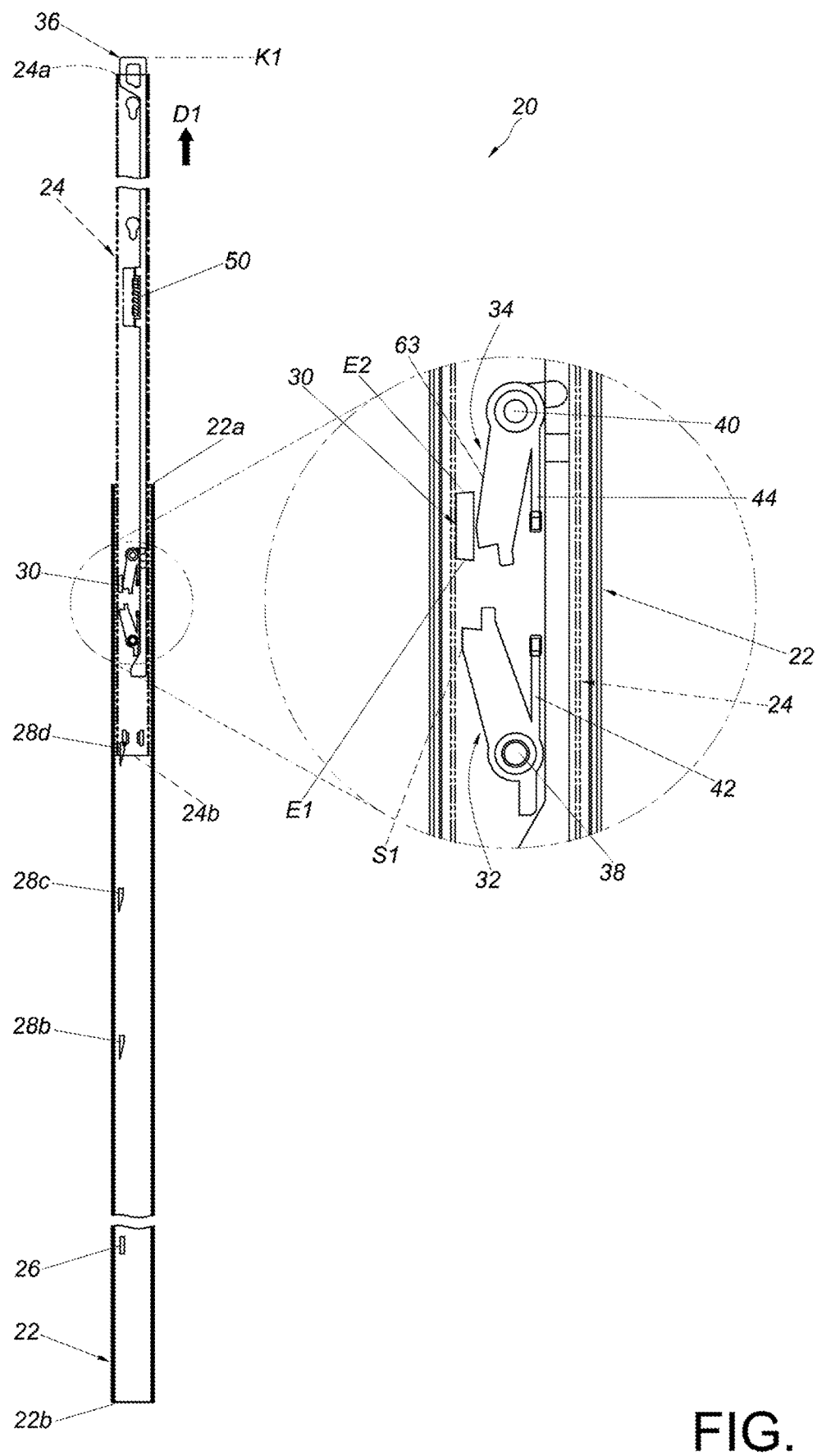
FIG. 12 is a diagram illustrating that the second rail is displaced from a position as shown in FIG. 11 along the first direction according to the embodiment of the present invention.
Figure 13:
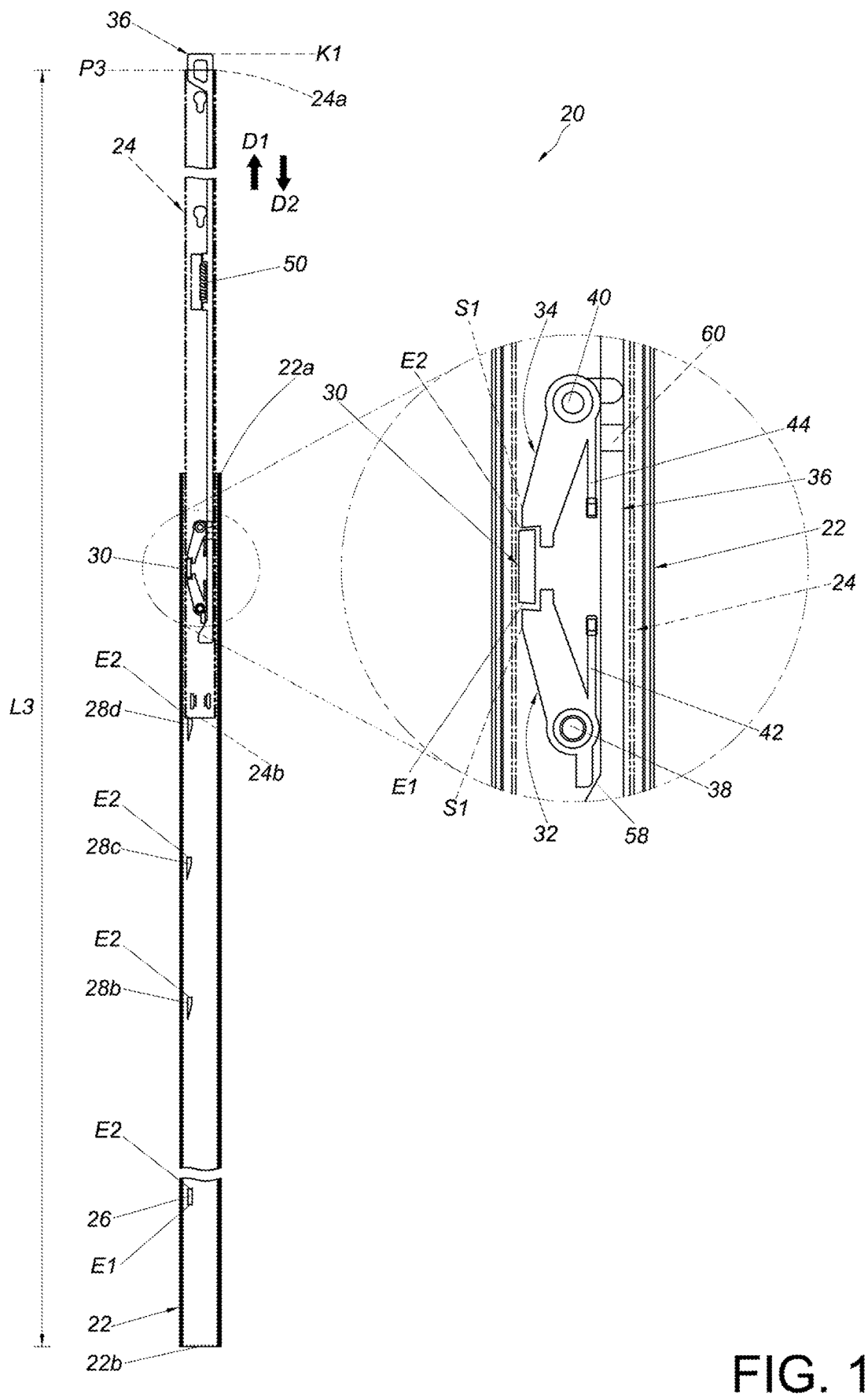
FIG. 13 is a diagram illustrating that the second rail is prevented from displacing from the third predetermined position along the first direction or the second direction according to the embodiment of the present invention.

As shown in FIG. 11, FIG. 12 and FIG. 13, the blocking member 34 includes a guiding portion 63. For example, the guiding portion 63 can be an inclined surface or an arc surface. During a displacement of the second rail 24 from a position as shown in FIG. 11 to a third predetermined position P3 as shown in FIG. 13, e.g., an extended position, along the first direction D1, the guiding portion 63 of the blocking member 34 in the first state S1 can be abutted by the second positioning structure 30 to drive the blocking member 34 to pivot and resiliently deform the first resilient portion 44, so as to pass over the first end E1 of the second positioning structure 30. As shown in FIG. 13, when the second rail 24 is located at the third predetermined position P3 relative to the first rail 22, the blocking member 34 can recover back to the first state S1 in response to the resilient force provided by the first resilient portion 44, so as to block the second end E2 of the second positioning structure 30 for preventing the second rail 24 from displacing from the third predetermined position P3 along the second direction D2. Furthermore, as shown in FIG. 13, when the second rail 24 is located at the third predetermined position P3 relative to the first rail 22, the releasing member 32 is in the first state S1 and blocks the first end E1 of the second positioning structure 30 for preventing the second rail 24 from displacing from the third predetermined position P3 along the first direction D1.

From the above, as shown in FIG. 13, when the second rail 24 is located at the third predetermined position P3 relative to the first rail 22, the releasing member 32 in the first state S1 and the blocking member 34 in the first state S1 block the first end E1 and the second end E2 of the second positioning structure 30 respectively to generate the bidirectional blocking effect for preventing the second rail 24 from displacing from the third predetermined position P3 along the first direction D1 or the second direction D2. Furthermore, as shown in FIG. 13, when the second rail 24 is located at the third predetermined position P3, the slide rail assembly 20 has a third length L3. As shown in FIG. 13 and FIG. 7, the third length L3 is greater than the second length L2. As shown in FIG. 7 and FIG. 5, the second length L2 is greater than the first length L1.

Figure 14:
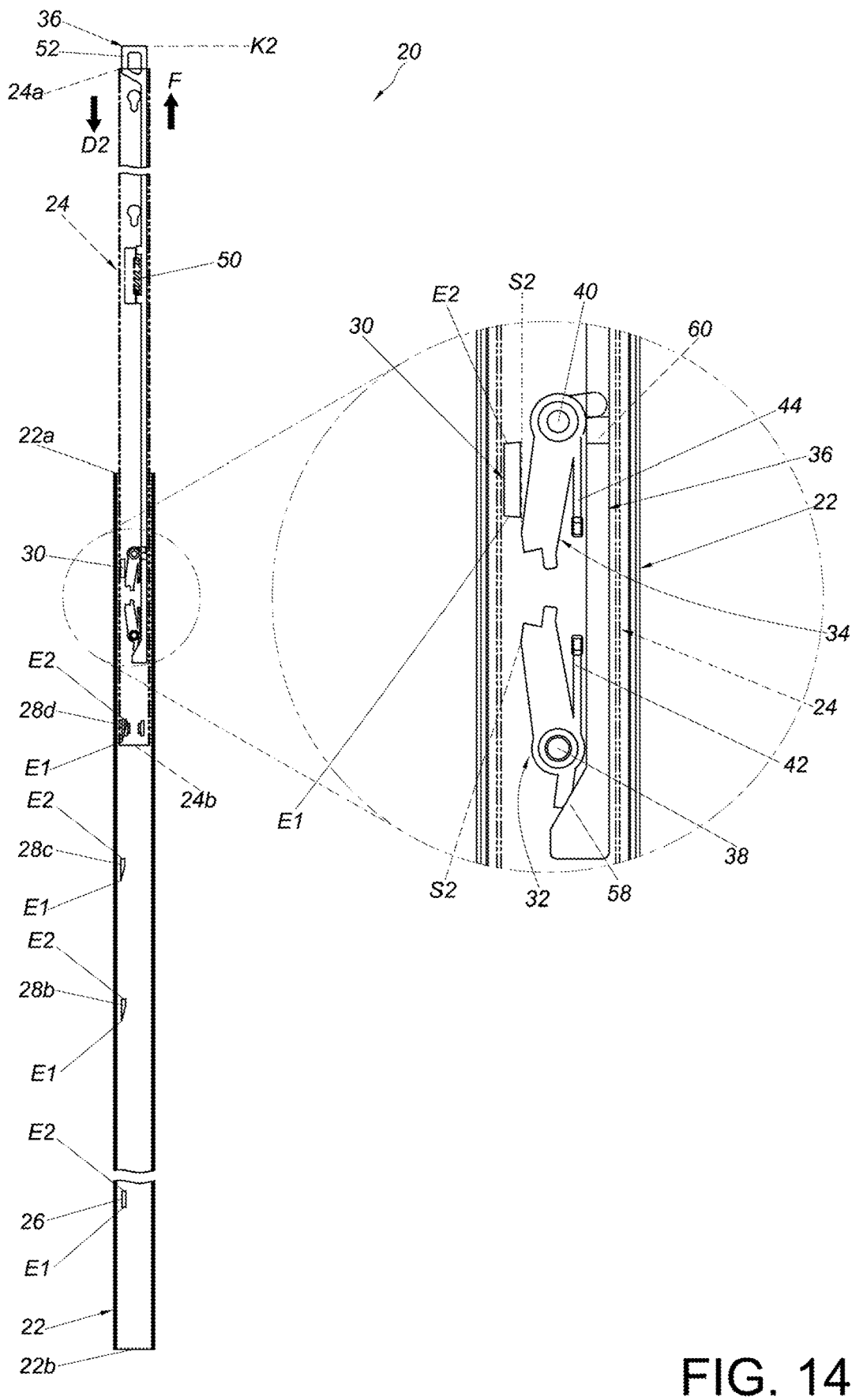
FIG. 14 is a diagram illustrating that the second rail is displaced from the third predetermined position along the second direction according to the embodiment of the present invention.

As shown in FIG. 14, when the second rail 24 is located at the third predetermined position P3, the releasing member 32 in the second state S2 and the blocking member 34 in the second state S2 do not block the first end E1 and the second end E2 of the second positioning structure 30 respectively, so as to allow the second rail 24 to displace from the third predetermined position P3 along the first direction D1 or along the second direction D2, e.g., for allowing a detaching movement or a retracting movement of the second rail 24 relative to the first rail 22.

For example, when the second rail 24 is located at the third predetermined position P3, the operating portion 52 of the operating member 36 can be applied by the force F to drive the operating member 36 to move from the first operating position K1 to the second operating position K2 for driving the releasing member 32 and the blocking member 34 to move from the first state S1 to the second state S2 respectively, such that the releasing member 32 and the blocking member 34 do not block the first end E1 and the second end E2 of the second positioning structure 30 respectively, so as to allow the second rail 24 to displace from the third predetermined position P3 along the first direction D1 or along the second direction D2, e.g., for allowing the detaching movement or the retracting movement of the second rail 24 relative to the first rail 22.

Figure 15:
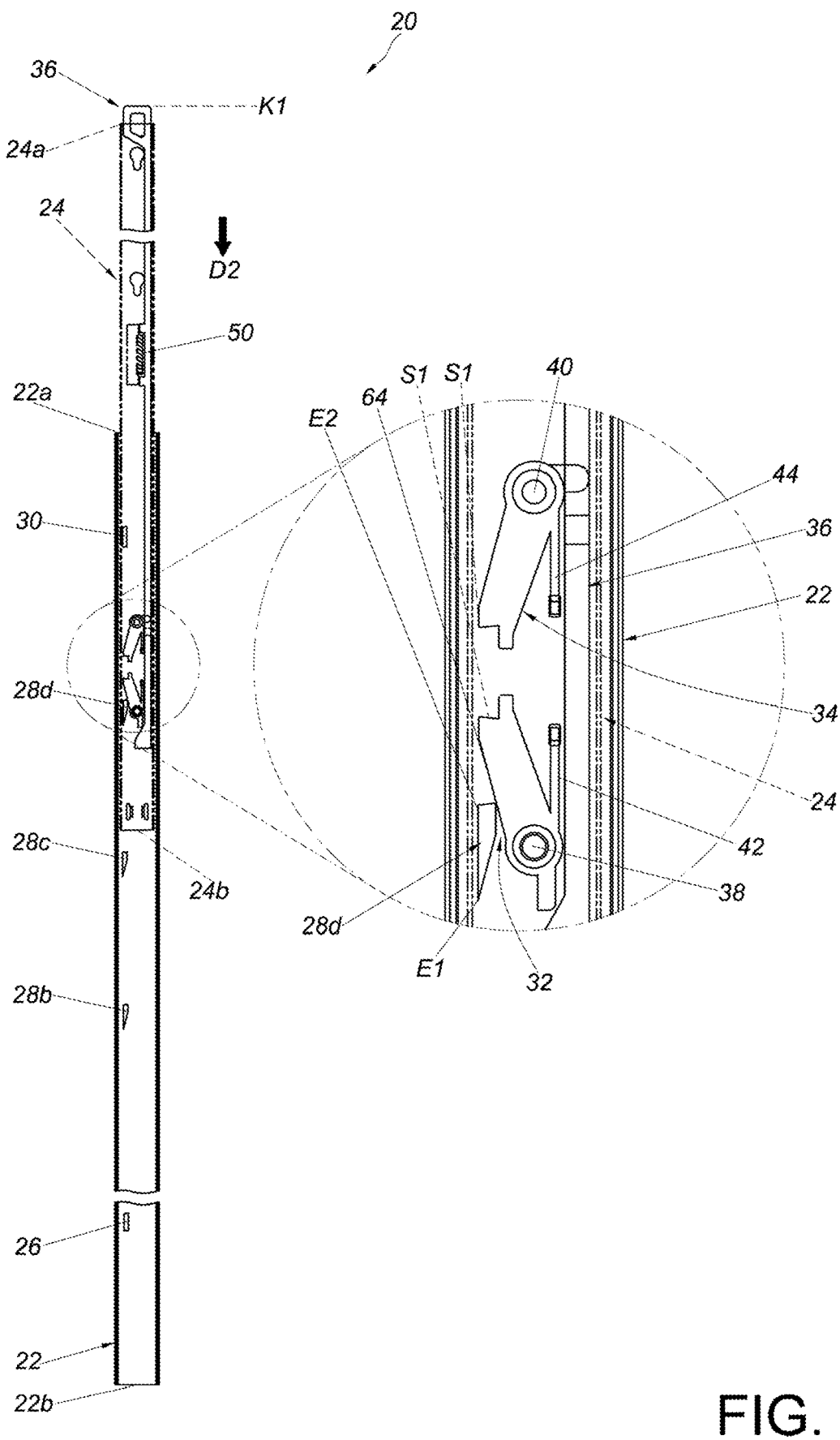
FIG. 15 is a diagram illustrating that the second rail is displaced from a position as shown in FIG. 14 along the second direction according to the embodiment of the present invention.

It should be noticed that when the second rail 24 is displaced from the third predetermined position P3, e.g., to a position as shown in FIG. 15, along the second direction D2 and the operating member 36 is released from the force F for recovering the operating member 36 back to the first operating position K1, the releasing member 32 and the blocking member 34 can recover back to the first state S1 in response to the resilient forces provided by the second resilient portion 42 and the first resilient portion 44. Afterwards, when the second rail 24 is further displaced from the third predetermined position P3 along the second direction D2, the blocking member 34 in the first state S1 is configured to block the second end E2 of one of the first assisting structure 28a, the second assisting structure 28b, the third assisting structure 28c and the fourth assisting structure 28d to generate the unidirectional blocking effect. In order to terminate the unidirectional blocking effect, the operating member 36 has to be applied by the force F to drive the blocking member 34 to move from the first state S1 to the second state S2, such that the blocking member 34 in the second state S2 does not block the second end E2 of one of the first assisting structure 28a, the second assisting structure 28b, the third assisting structure 28c and the fourth assisting structure 28d for allowing the second rail 24 to displace to the first predetermined position P1 as shown in FIG. 5, e.g., the retracted position, along the second direction D2. As shown in FIG. 5, when the second rail 24 is located at the first predetermined position P1, the releasing member 32 in the first state S1 and the blocking member 34 in the first state S1 block the first end E1 and the second end E2 of the first positioning structure 26 respectively to generate the bidirectional blocking effect for preventing the second rail 24 from displacing from the first predetermined position P1 along the first direction D1 or the second direction D2.

Figure 16:
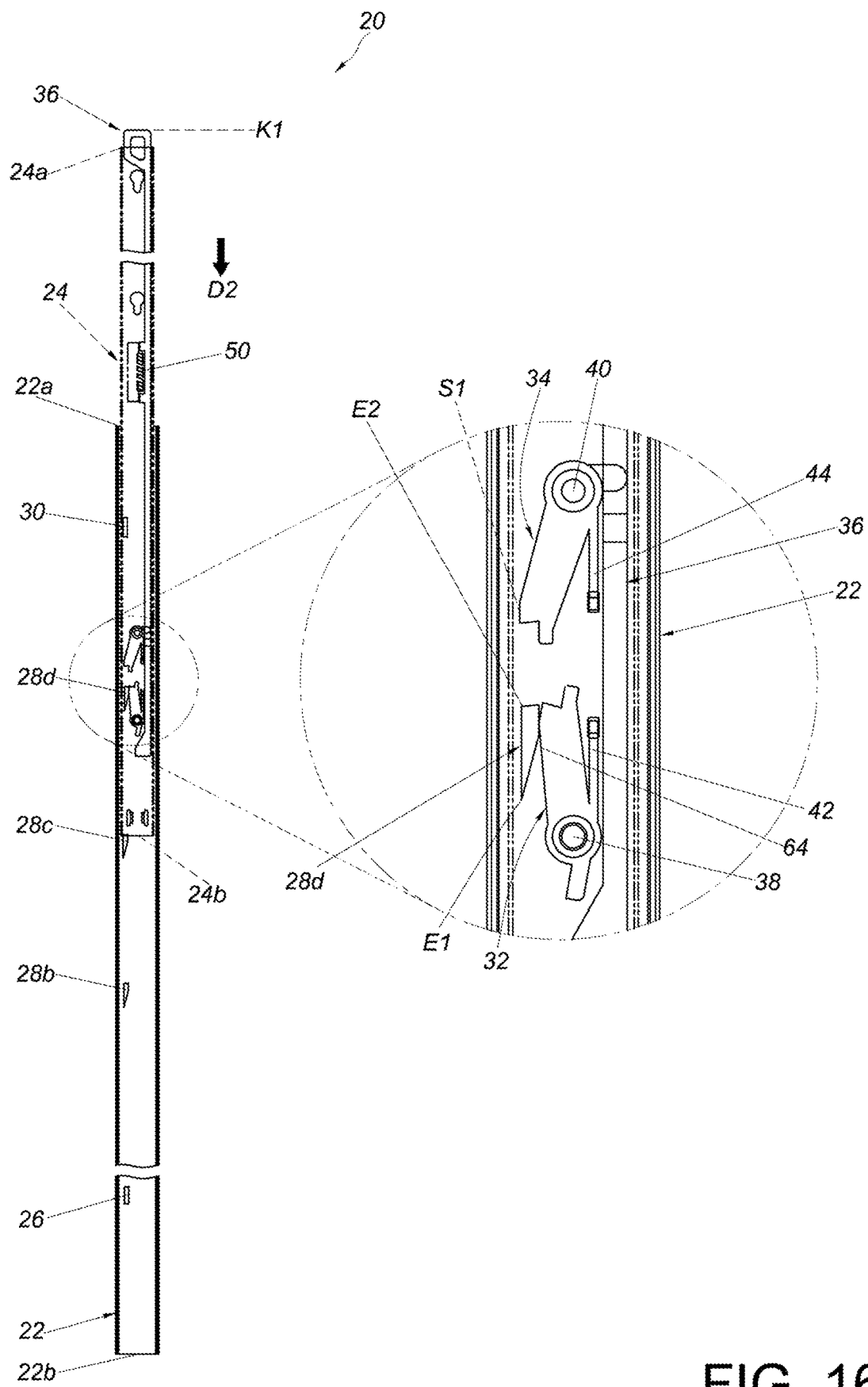
FIG. 16 is a diagram illustrating that the second rail is displaced from a position as shown in FIG. 15 along the second direction according to the embodiment of the present invention.
Figure 17:
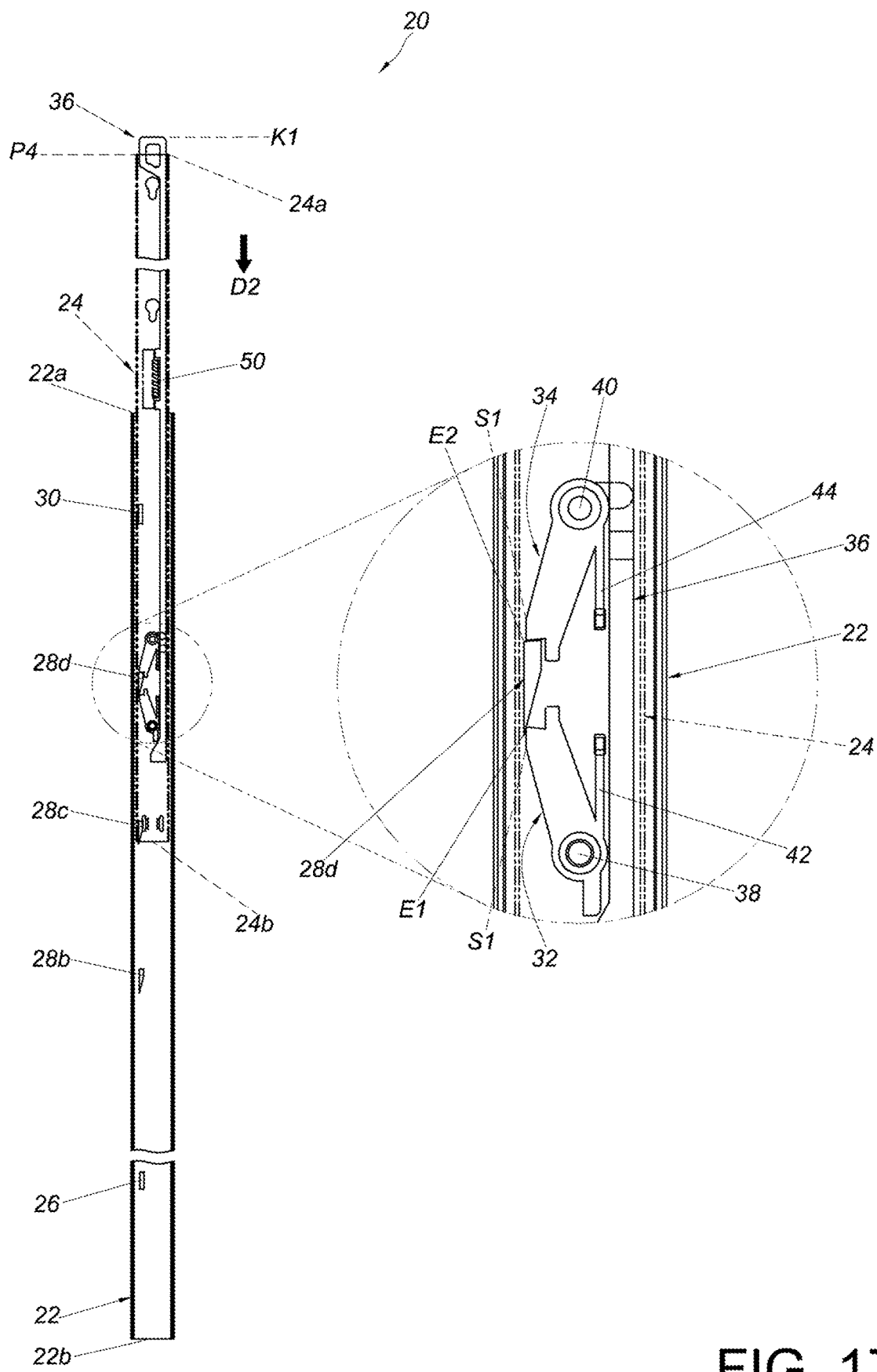
FIG. 17 is a diagram illustrating that the second rail is prevented from displacing from a fourth predetermined position along the second direction according to the embodiment of the present invention.

For example, as shown in FIG. 15 to FIG. 17, the releasing member 32 includes a guiding feature 64 which can be an inclined surface or an arc surface. When the second rail 24 is displaced from the third predetermined position P3, e.g., to the position as shown in FIG. 15, along the second direction D2 and the operating member 36 is released from the force F for recovering the operating member 36 back to the first operating position K1, the releasing member 32 and the blocking member 34 can recover back to the first state S1. During a displacement of the second rail 24 from the position as shown in FIG. 15 to a fourth predetermined position as shown in FIG. 17, the guiding feature 64 of the releasing member 32 can be abutted by the fourth assisting structure 28d to pivot the releasing member 32 to pass over the second end E2 of the fourth assisting structure 28d. When the releasing member 32 passes over the second end E2 of the fourth assisting structure 28d, the blocking member 34 in the first state S1 blocks the second end E2 of the fourth assisting structure 28d to generate the unidirectional blocking effect for preventing the second rail 24 from displacing from the fourth predetermined position P4 along the second direction D2.

Figure 18:
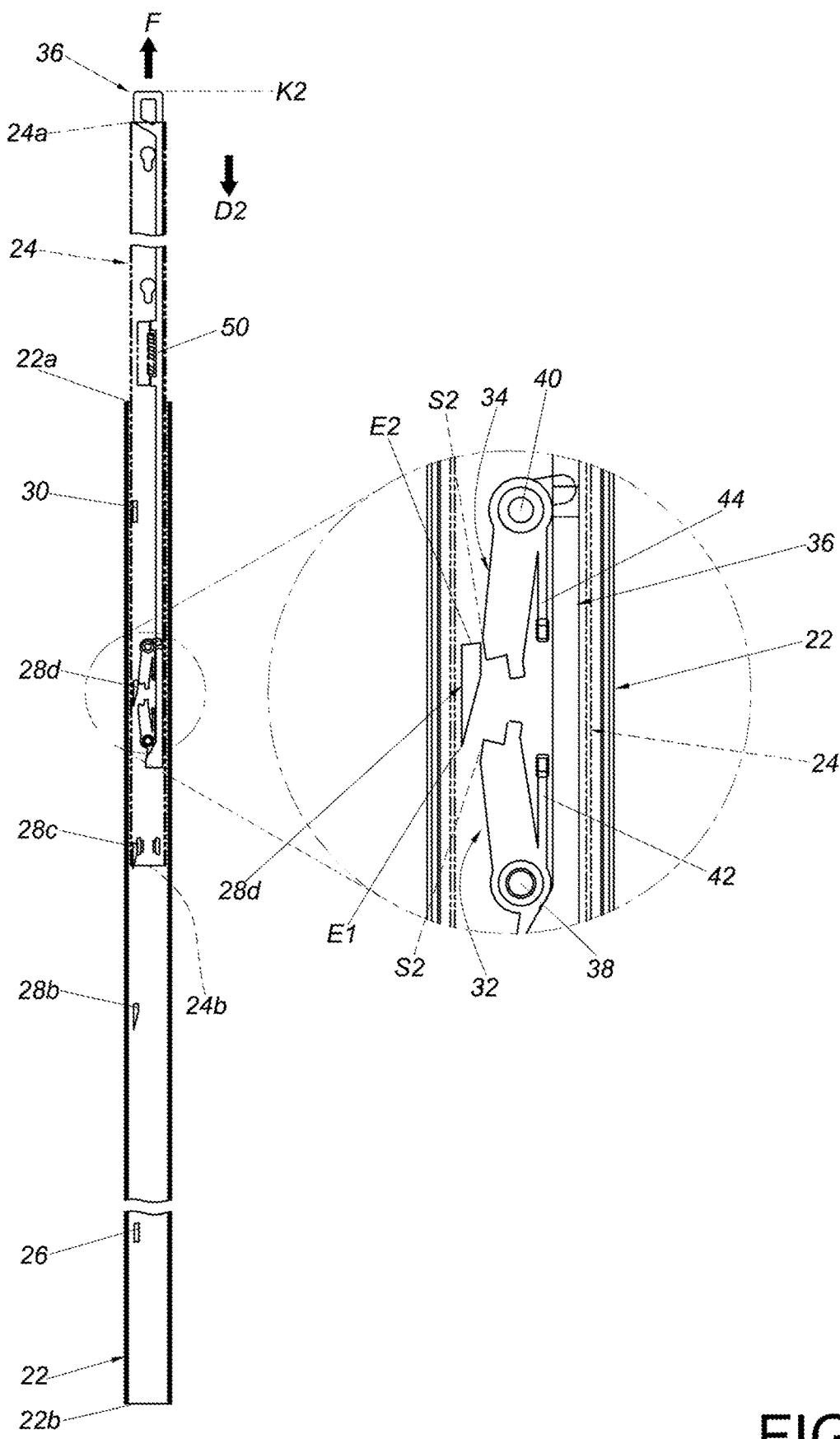
FIG. 18 is a diagram illustrating that the second rail is displaced from the fourth predetermined position along the second direction according to the embodiment of the present invention.

As shown in FIG. 17 and FIG. 18, when it is desired to terminate a blocking relation of the blocking member 34 and the fourth assisting structure 28d, the operating member 36 has to be applied by the force F to drive the blocking member 34 to move from the first state S1 to the second state S2, such that the blocking member 34 does not block the second end E2 of the fourth assisting structure 28d for allowing the second rail 24 to displace from the fourth predetermined position P4 toward the first predetermined position P1 along the second direction D2.

Similarly, as shown in FIG. 7, when it is desired to terminate a blocking relation of the blocking member 34 and the second assisting structure 28b, the operating member 36 has to be applied by the force F to drive the blocking member 34 to move from the first state S1 to the second state S2, such that the blocking member 34 does not block the second end E2 of the second assisting structure 28b for allowing the second rail 24 to displace from the second predetermined position P2 toward the first predetermined position P1 along the second direction D2.

From the above, during a displacement of the second rail 24 from the third predetermined position P3 to the first predetermined position P1, if the operating member 36 is not operated to drive the blocking member 34 to move from the first state S1 to the second state S2, the blocking member 34 in the first state S1 can block the second end E2 of one of the first assisting structure 28a, the second assisting structure 28b, the third assisting structure 28c and the fourth assisting structure 28d for preventing a nonstop direct displacement of the second rail 24 from the third predetermined position P3, e.g., the extended position, to the first predetermined position P1, e.g., the retracted position, along the second direction D2.

Figure 19:
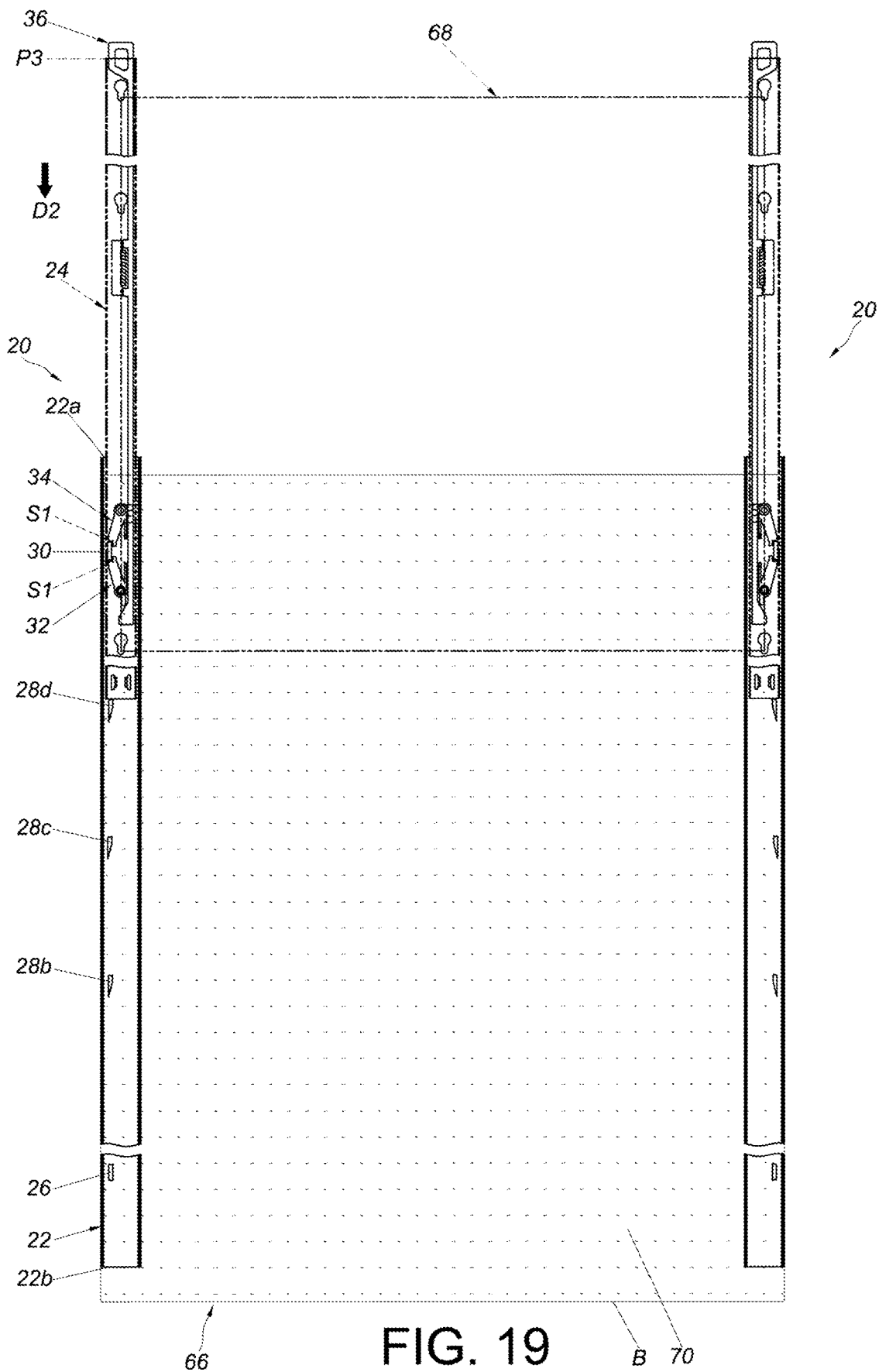
FIG. 19 is a diagram illustrating that the slide rail assembly is adapted for a first object and a second object and the second rail is prevented from displacing from the third predetermined position along the first direction or the second direction according to the embodiment of the present invention.
Figure 20:
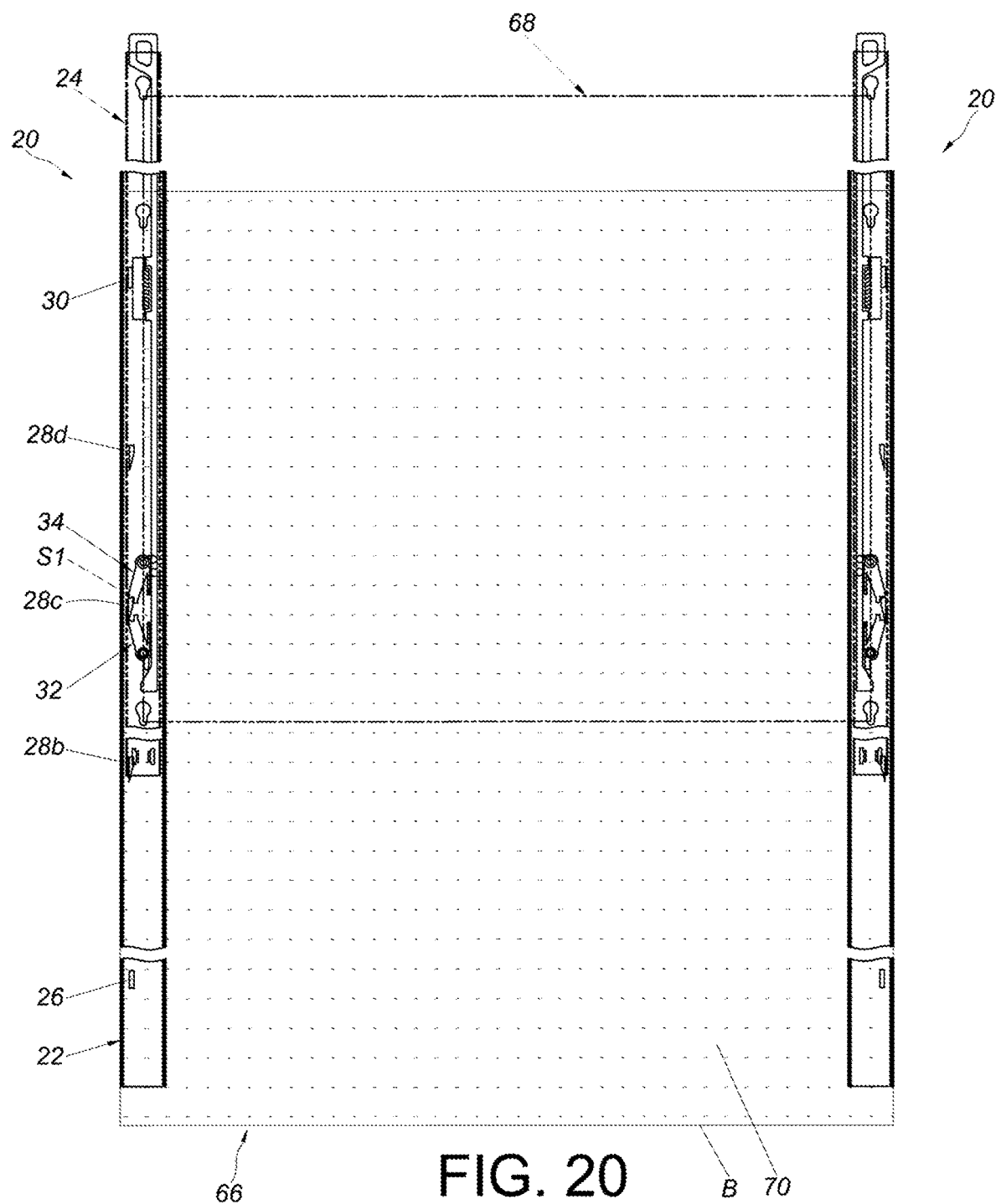
FIG. 20 is a diagram illustrating that the slide rail assembly is adapted for the first object and the second object and the second rail is prevented from displacing from the first predetermined position along the first direction or the second direction according to the embodiment of the present invention.

As shown in FIG. 19 and FIG. 20, the slide rail assembly 20 is adapted for a first object 66 and a second object 68. The first object 66 includes a receiving space 70 for receiving liquid, which is illustrated by dots. The second object 68 can be a carried object, e.g., a chassis. The slide rail assembly 20 is arranged in the vertical state. For example, the rear end portion 22b of the first rail 22 faces downwardly, e.g., toward a bottom portion B of the first object 66. The front end portion 22a of the first rail 22 faces upwardly. The first rail 22 is mounted or fixed on the first object 66 and located inside the receiving space 70. The second rail 24 is configured to support the second object 68. The second object 68 can be positioned at different positions relative to the first object 66 by the slide rail assembly 20. For example, as shown in FIG. 19, when the second rail 24 is located at the third predetermined position P3, e.g., the extended position, relative to the first rail 22, the second object 68 can be positioned at a highest using position relative to first object 66. At this moment, the operating member 36 can be operated to drive the blocking member 34, such that the blocking member 34 does not block the second end E2 of the second positioning structure 30 for allowing the second rail 24 to displace along the second direction D2, so as to lower the second object 68 relative to the first object 66. During the displacement of the second rail 24 from the third predetermined position P3 to the first predetermined position P1 along the second direction D2, the blocking member 34 in the first state S1 can block one of the first assisting structure 28a, the second assisting structure 28b, the third assisting structure 28c and the fourth assisting structure 28d for preventing the nonstop direct displacement of the second rail 24 from the third predetermined position P3 to the first predetermined position P1 due to gravity, which prevents a collision damage of the second object 68.

Understandably, the present invention is not limited to the aforementioned embodiment. For example, in another embodiment, the first positioning structure and the second positioning structure can be replaced by a fifth assisting structure and a sixth assisting structure respectively, and the releasing member can be omitted, wherein the each of the fifth assisting structure and the sixth assisting structure can be identical to the first assisting structure, the second assisting structure, the third assisting structure and the fourth assisting structure, such that the second object is displaceable relative to the first object along the first direction from the first predetermined position to the third predetermined position without operation of the operating member, and the second object can be supported at different positions by a one-way blocking effect generated by a blocking relation of the blocking member and the second end of the corresponding assisting structure.

In summary, the slide rail assembly 20 includes the following characteristics:

1. The first positioning structure 26, the first assisting structure 28a, the second assisting structure 28b, the third assisting structure 28c, the fourth assisting structure 28d and the second positioning structure 30 enable the second rail 24 to be positioned at different positions, e.g., the first predetermined position P1, the second predetermined position P2, the third predetermined position P3 and the fourth predetermined position P4. When the second rail 24 is located at the first position P1 and the third predetermined position P3, the bidirectional blocking effect is generated for preventing the second rail 24 from displacing along the first direction or the second direction D2. When the second rail 24 is located at the other predetermined positions, the unidirectional blocking effect is generated for preventing the second rail 24 from displacing along the second direction D2. Besides, the operating member 36 is configured to terminate the bidirectional blocking effect or the unidirectional blocking effect.

2. When the slide rail assembly 20 is arranged in the vertical state, during the displacement of the second rail 24 from the third predetermined position P3 to the first predetermined position P1 along the second direction D2, the blocking member 34 in the first state S1 is configured to block one of the first assisting structure 28a, the second assisting structure 28b, the third assisting structure 28c and the fourth assisting structure 28d for preventing the nonstop direct displacement of the second rail 24 from the third predetermined position P3 to the first predetermined position P1 due to gravity, which prevents the collision damage of the second object 68.

3. The releasing member 32 and the blocking member 34 are configured to block one of the first positioning structure 26 and the second positioning structure 30 respectively to generate the bidirectional blocking effect. However, the releasing member can be omitted for generating the unidirectional blocking effect when it is desired to restrain the displacement of the second rail 24 along the second direction D2 only.

4. The releasing member 32 and the blocking member 34 can be made of non-metallic material, e.g., plastic material, so as to prevent any metal chipping during the aforementioned operating process. Therefore, the present invention is suitable for being used in a liquid environment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly comprising:
   a first rail, a first positioning structure, at least one assisting structure and a second positioning structure being arranged on the first rail;
   a second rail displaceable relative to the first rail;
   a releasing member movably mounted on the second rail;
   a blocking member movably mounted on the second rail; and
   an operating member movably mounted on the second rail, the operating member being configured to operate the releasing member and the blocking member to move from a first state to a second state;
   wherein when the second rail is located at a first predetermined position relative to the first rail, the releasing member in the first state and the blocking member in the first state block two ends of the first positioning structure respectively for preventing the second rail from displacing from the first predetermined position along a first direction or a second direction opposite to the first direction;
   wherein when the second rail is located at a second predetermined position relative to the first rail, the blocking member in the first state blocks one of two ends of the at least one assisting structure for preventing the second rail from displacing from the second predetermined position along the second direction;
   wherein when the second rail is located at a third predetermined position, the releasing member in the first state and the blocking member in the first state block two ends of the second positioning structure respectively for preventing the second rail from displacing from the third predetermined position along the first direction or the second direction;
   wherein the second predetermined position is located between the first predetermined position and the third predetermined position;
   wherein a blocking section is arranged on the one of the two ends of the at least one assisting structure in an immovable configuration;
   wherein the blocking member blocks the blocking section to prevent the second rail from displacing from the second predetermined position along the second direction until the blocking member is operated from the first state to the second state by the operating member.

2. The slide rail assembly of claim 1, wherein the at least one assisting structure is located between the first positioning structure and the second positioning structure.

3. The slide rail assembly of claim 1, further comprising a first resilient portion and a second resilient portion configured to resiliently retain the blocking member and the releasing member in the first state respectively.

4. The slide rail assembly of claim 1, further comprising a recovering resilient member configured to provide a recovering resilient force to the operating member.

5. The slide rail assembly of claim 1, wherein a guiding section is arranged adjacent to another one of the two ends of the at least one assisting structure.

6. The slide rail assembly of claim 1, wherein each of the first rail and the second rail comprises a front end portion and a rear end portion, the first positioning structure is located adjacent to the rear end portion of the first rail, and the second positioning structure is located adjacent to the front end portion of the first rail.

7. The slide rail assembly of claim 6, wherein the releasing member and the blocking member are located adjacent to the rear end portion of the second rail.

8. The slide rail assembly of claim 7, wherein the operating member comprises an operating portion located adjacent to the front end portion of the second rail.

9. The slide rail assembly of claim 1, wherein at least one of the releasing member and the blocking member is made of plastic material.

10. The slide rail assembly of claim 1, wherein the slide rail assembly is adapted for a first object and a second object, the slide rail assembly is arranged in a vertical state, the first rail is able to be mounted on the first object and located inside a receiving space of the first object, and the second rail is able to support the second object.

11. A slide rail assembly comprising:
    a first rail, an assisting structure and a positioning structure being arranged on the first rail;
    a second rail displaceable relative to the first rail between a retracted position and an extended position;
    a blocking member movably mounted on the second rail;
    a first resilient portion configured to resiliently retain the blocking member in a first state; and
    an operating member movably mounted on the second rail, the operating member being configured to operate the blocking member to move from the first state to a second state;
    wherein when the second rail is located at the extended position relative to the first rail, the blocking member in the first state blocks the positioning structure for preventing the second rail from displacing from the extended position along a retracting direction;
    wherein when the operating member is applied by a force to drive the blocking member to move from the first state to the second state, the blocking member does not block the positioning structure for allowing the second rail to displace from the extended position along the retracting direction, and when the second rail is displaced from the extended position along the retracting direction and the operating member is released from the force, the blocking member moves from the second state back to the first state in response to a resilient force provided by the first resilient portion;
    wherein when the second rail is displaced to a predetermined position relative to the first rail along the retracting direction, the blocking member in the first state blocks the assisting structure for preventing the second rail from displacing from the predetermined position along the retracting direction;

when the second rail is located at the predetermined position relative to the first rail, the operating member is configured to drive the blocking member to move from the first state to the second state, such that the blocking member does not block an end of the assisting structure for allowing the second rail to displace to the retracted position along the retracting direction;

wherein the predetermined position is located between the extended position and the retracted position;

wherein a blocking section is arranged on the end of the assisting structure in an immovable configuration;

wherein the blocking member blocks the blocking section to prevent the second rail from displacing from the predetermined position along the retracting direction until the blocking member is operated from the first state to the second state by the operating member.

12. The slide rail assembly of claim 11, wherein another positioning structure is further arranged on the first rail, the assisting structure is located between the positioning structure and the another positioning structure, the slide rail assembly further comprises a releasing member, when the second rail is displaced relative to the first rail from the predetermined position to the retracted position along the retracting direction, the releasing member and the blocking member block two ends of the another positioning structure respectively for preventing the second rail from displacing from the retracted position along an opening direction or the retracting direction.

13. The slide rail assembly of claim 12, wherein each of the first rail and the second rail comprises a front end portion and a rear end portion, the another positioning structure is located adjacent to the rear end portion of the first rail, the positioning structure is located adjacent to the front end portion of the first rail, and the releasing member and the blocking member are located adjacent to the rear end portion of the second rail.

14. The slide rail assembly of claim 13, further comprising a second resilient portion, and the first resilient portion and the second resilient portion being integrally formed with the blocking member and the releasing member respectively.

15. The slide rail assembly of claim 13, wherein the slide rail assembly is adapted for a first object and a second object, the slide rail assembly is arranged in a vertical state, the first rail is able to be mounted on the first object and located inside a receiving space of the first object, and the second rail is able to support the second object.

16. A slide rail assembly comprising:
a first rail, a plurality of assisting structures being arranged on the first rail, adjacent two of the plurality of assisting structures being spaced from each other by a predetermined longitudinal distance;
a second rail longitudinally displaceable relative to the first rail between a retracted position and an extended position;
a blocking member movably mounted on the second rail;
a first resilient portion configured to provide a resilient force to resiliently retain the blocking member in a first state; and
an operating member movably mounted on the second rail, the operating member being configured to operate the blocking member to move from the first state to a second state;
wherein the blocking member in the first state is configured to block one of the plurality of assisting structures for preventing the second rail from displacing from a predetermined position along a retracting direction;
wherein the operating member is configured to operate the blocking member to move from the first state to the second state, such that the blocking member does not block the one of the plurality of assisting structures for allowing the second rail to displace to the retracted position along the retracting direction;
wherein the predetermined position is located between the extended position and the retracted position;
wherein a blocking section is arranged on an end of the one of the plurality of assisting structures in an immovable configuration;
wherein the blocking member blocks the blocking section to prevent the second rail from displacing from the predetermined position along the retracting direction until the blocking member is operated from the first state to the second state by the operating member.

17. The slide rail assembly of claim 16, wherein a first positioning structure and a second positioning structure are arranged on the first rail, and the plurality of assisting structures are located between the first positioning structure and the second positioning structure.

18. The slide rail assembly of claim 16, further comprising a releasing member, wherein when the second rail is located at the retracted position relative to the first rail, the releasing member and the blocking member block two ends of the first positioning structure respectively for preventing the second rail from displacing from the retracted position along an opening direction or the retracting direction, and when the second rail is located at the extended position relative to the first rail, the releasing member and the blocking member block two ends of the second positioning structure respectively for preventing the second rail from displacing from the extended position along the opening direction or the retracting direction.

19. The slide rail assembly of claim 16, wherein the slide rail assembly is adapted for a first object and a second object, the slide rail assembly is arranged in a vertical state, the first rail is able to be mounted on the first object and located inside a receiving space of the first object, and the second rail is able to support the second object.

* * * * *